US008603252B2

(12) United States Patent
Dimeo et al.

(10) Patent No.: US 8,603,252 B2
(45) Date of Patent: Dec. 10, 2013

(54) CLEANING OF SEMICONDUCTOR PROCESSING SYSTEMS

(75) Inventors: Frank Dimeo, Falls Church, VA (US); James Dietz, Allison Park, PA (US); W. Karl Olander, Indian Shores, FL (US); Robert Kaim, Brookline, MA (US); Steven Bishop, Corrales, NM (US); Jeffrey W. Neuner, Bethel, CT (US); Jose Arno, Brookfield, CT (US); Paul J. Marganski, Seymore, CT (US); Joseph D. Sweeney, New Milford, CT (US); David Eldridge, Liberty Hill, TX (US); Sharad Yedave, Danbury, CT (US); Oleg Byl, Southbury, CT (US); Gregory T. Stauf, Branchburg, NJ (US)

(73) Assignee: Advanced Technology Materials, Inc., Danbury, CT (US)

( * ) Notice: Subject to any disclaimer, the term of this patent is extended or adjusted under 35 U.S.C. 154(b) by 792 days.

(21) Appl. No.: 12/298,727

(22) PCT Filed: Apr. 26, 2007
(Under 37 CFR 1.47)

(86) PCT No.: PCT/US2007/067542
§ 371 (c)(1),
(2), (4) Date: Jan. 19, 2010

(87) PCT Pub. No.: WO2007/127865
PCT Pub. Date: Nov. 8, 2007

(65) Prior Publication Data
US 2010/0154835 A1    Jun. 24, 2010

Related U.S. Application Data

(60) Provisional application No. 60/795,216, filed on Apr. 26, 2006, provisional application No. 60/832,037, filed on Jul. 20, 2006, provisional application No. 60/826,409, filed on Sep. 21, 2006, provisional application No. 60/888,311, filed on Feb. 5, 2007.

(51) Int. Cl.
*B08B 7/00* (2006.01)
(52) U.S. Cl.
USPC ......................................... 134/1.1; 134/22.1

(58) Field of Classification Search
USPC .................................... 134/22.18, 22.1, 22.16
See application file for complete search history.

(56) References Cited

U.S. PATENT DOCUMENTS

| 5,144,147 A | 9/1992 | Shiozaki et al. |
|---|---|---|
| 5,347,460 A | 9/1994 | Gifford et al. |

(Continued)

FOREIGN PATENT DOCUMENTS

| EP | 0474108 A1 | 3/1992 |
|---|---|---|
| EP | 0714999 A1 | 6/1996 |

(Continued)

OTHER PUBLICATIONS

English Machine Translation of JP 10-280151A.*

(Continued)

*Primary Examiner* — Nicole Blan
(74) *Attorney, Agent, or Firm* — Hultquist, PLLC; Steven J. Hultquist; Maggie Chappuis

(57) ABSTRACT

A method and apparatus for cleaning residue from components of semiconductor processing systems used in the fabrication of microelectronic devices. To effectively remove residue, the components are contacted with a gas-phase reactive material for sufficient time and under sufficient conditions to at least partially remove the residue. When the residue and the material from which the components are constructed are different, the gas-phase reactive material is selectively reactive with the residue and minimally reactive with the materials from which the components of the ion implanter are constructed. When the residue and the material from which the components are constructed is the same, then the gas-phase reactive material may be reactive with both the residue and the component part. Particularly preferred gas-phase reactive materials utilized comprise gaseous compounds such as $XeF_2$, $XeF_4$, $XeF_6$, $NF_3$, $IF_5$, $IF_7$, $SF_6$, $C_2F_6$, $F_2$, $CF_4$, $KrF_2$, $Cl_2$, $HCl$, $ClF_3$, $ClO_2$, $N_2F_4$, $N_2F_2$, $N_3F$, $NFH_2$, $NH_2F$, $HOBr$, $Br_2$, $C_3F_8$, $C_4F_8$, $C_5F_8$, $CHF_3$, $CH_2F_2$, $CH_3F$, $COF_2$, $HF$, $C_2HF_5$, $C_2H_2F_4$, $C_2H_3F_3$, $C_2H_4F_2$, $C_2H_5F$, $C_3F_6$, and organochlorides such as $COCl_2$, $CCl_4$, $CHCl_3$, $CH_2Cl_2$ and $CH_3Cl$.

6 Claims, 19 Drawing Sheets

(56) References Cited

U.S. PATENT DOCUMENTS

| | | | |
|---|---|---|---|
| 5,370,568 A | 12/1994 | Ivins et al. | |
| 5,413,670 A | 5/1995 | Langan et al. | |
| 5,421,957 A | 6/1995 | Carlson et al. | |
| 5,554,845 A | 9/1996 | Russell | |
| 5,554,854 A | 9/1996 | Blake | |
| 5,565,038 A | 10/1996 | Ashley | |
| 5,620,526 A | 4/1997 | Watatani et al. | |
| 5,633,506 A | 5/1997 | Blake | |
| 5,767,021 A | 6/1998 | Imai et al. | |
| 5,851,270 A | 12/1998 | Olander | |
| 5,940,724 A | 8/1999 | Warren | |
| 5,943,594 A | 8/1999 | Bailey et al. | |
| 5,953,615 A * | 9/1999 | Yu | 438/303 |
| 5,977,552 A | 11/1999 | Foad | |
| 5,988,187 A | 11/1999 | Trussell et al. | |
| 6,033,973 A * | 3/2000 | Takemura | 438/514 |
| 6,135,128 A * | 10/2000 | Graf et al. | 134/1.1 |
| 6,143,191 A | 11/2000 | Baum et al. | |
| 6,221,169 B1 * | 4/2001 | Bernstein et al. | 134/2 |
| 6,224,785 B1 | 5/2001 | Wojtczak et al. | |
| 6,254,792 B1 | 7/2001 | Van Buskirk et al. | |
| 6,259,105 B1 | 7/2001 | Eddy et al. | |
| 6,267,909 B1 | 7/2001 | Currie et al. | |
| 6,290,864 B1 | 9/2001 | Patel et al. | |
| 6,306,807 B1 | 10/2001 | Wojtczak et al. | |
| 6,322,600 B1 | 11/2001 | Brewer et al. | |
| 6,322,756 B1 | 11/2001 | Arno et al. | |
| 6,344,432 B1 | 2/2002 | Wojtczak et al. | |
| 6,355,933 B1 | 3/2002 | Tripsas et al. | |
| 6,379,575 B1 | 4/2002 | Yin et al. | |
| 6,409,876 B1 | 6/2002 | McQuarrie et al. | |
| 6,455,903 B1 * | 9/2002 | Yu | 257/391 |
| 6,534,007 B1 * | 3/2003 | Blonigan et al. | 422/62 |
| 6,559,462 B1 | 5/2003 | Carpenter et al. | |
| 6,566,315 B2 | 5/2003 | Wojtczak et al. | |
| 6,620,225 B2 | 9/2003 | Wang et al. | |
| 6,620,256 B1 * | 9/2003 | Arno et al. | 134/2 |
| 6,685,803 B2 | 2/2004 | Lazarovich et al. | |
| 6,699,399 B1 | 3/2004 | Qian et al. | |
| 6,709,610 B2 | 3/2004 | Van Buskirk et al. | |
| 6,718,126 B2 | 4/2004 | Lei | |
| 6,756,600 B2 | 6/2004 | Ng et al. | |
| 6,767,836 B2 | 7/2004 | San et al. | |
| 6,812,648 B2 | 11/2004 | Luten et al. | |
| 6,841,008 B1 * | 1/2005 | Branco et al. | 134/26 |
| 6,841,141 B2 | 1/2005 | Arno et al. | |
| 6,843,258 B2 | 1/2005 | Shang et al. | |
| 6,843,858 B2 | 1/2005 | Rossman | |
| 6,846,424 B2 | 1/2005 | Baum et al. | |
| 6,851,432 B2 | 2/2005 | Naghshineh et al. | |
| 6,880,561 B2 | 4/2005 | Goto et al. | |
| 6,887,337 B2 | 5/2005 | Lebouitz et al. | |
| 6,902,629 B2 | 6/2005 | Zheng et al. | |
| 6,913,653 B2 | 7/2005 | Kanayama et al. | |
| 6,939,409 B2 | 9/2005 | Kanayama et al. | |
| 7,037,376 B2 | 5/2006 | Harvey et al. | |
| 7,037,813 B2 | 5/2006 | Collins et al. | |
| 7,080,545 B2 | 7/2006 | Dimeo, Jr. et al. | |
| 7,168,436 B2 | 1/2007 | Mouri et al. | |
| 7,186,385 B2 | 3/2007 | Ganguli et al. | |
| 7,201,174 B2 | 4/2007 | Fukiage | |
| 7,201,807 B2 | 4/2007 | Yim et al. | |
| 7,228,724 B2 | 6/2007 | Chen et al. | |
| 7,288,491 B2 | 10/2007 | Collins et al. | |
| 7,296,458 B2 | 11/2007 | Dimeo, Jr. et al. | |
| 7,296,460 B2 | 11/2007 | Dimeo, Jr. et al. | |
| 7,819,981 B2 | 10/2010 | DiMeo et al. | |
| 2002/0011463 A1 | 1/2002 | Buskirk et al. | |
| 2002/0033229 A1 | 3/2002 | Lebouitz et al. | |
| 2002/0083961 A1 | 7/2002 | Tsuga | |
| 2002/0106850 A1 * | 8/2002 | Iguchi et al. | 438/218 |
| 2003/0045961 A1 * | 3/2003 | Nakao | 700/121 |
| 2003/0053799 A1 | 3/2003 | Lei | |
| 2003/0098038 A1 | 5/2003 | Siegele et al. | |
| 2003/0183244 A1 | 10/2003 | Rossman | |
| 2004/0006249 A1 | 1/2004 | Hoshino et al. | |
| 2004/0016404 A1 | 1/2004 | Gregg et al. | |
| 2004/0074285 A1 | 4/2004 | Dimeo, Jr. et al. | |
| 2004/0080050 A1 | 4/2004 | McMillin et al. | |
| 2004/0108296 A1 | 6/2004 | Kanayama et al. | |
| 2004/0242018 A1 | 12/2004 | Rusli | |
| 2005/0016838 A1 | 1/2005 | Murata et al. | |
| 2005/0230046 A1 | 10/2005 | Lebouitz et al. | |
| 2005/0242379 A1 * | 11/2005 | Sakai et al. | 257/288 |
| 2005/0252529 A1 | 11/2005 | Ridgeway et al. | |
| 2005/0260354 A1 * | 11/2005 | Singh et al. | 427/523 |
| 2005/0279384 A1 * | 12/2005 | Guidotti | 134/18 |
| 2006/0005856 A1 | 1/2006 | Sun et al. | |
| 2006/0019039 A1 | 1/2006 | Hanawa et al. | |
| 2006/0086276 A1 | 4/2006 | Theilacker | |
| 2006/0086376 A1 | 4/2006 | Dimeo, Jr. et al. | |
| 2006/0115590 A1 | 6/2006 | Suzuki et al. | |
| 2006/0169915 A1 | 8/2006 | Olson et al. | |
| 2006/0272775 A1 | 12/2006 | Horsky et al. | |
| 2006/0272776 A1 | 12/2006 | Horsky et al. | |
| 2007/0108395 A1 | 5/2007 | Horsky et al. | |
| 2007/0117396 A1 | 5/2007 | Wu et al. | |
| 2007/0210260 A1 | 9/2007 | Horsky et al. | |
| 2007/0241689 A1 | 10/2007 | Horsky et al. | |
| 2007/0259111 A1 | 11/2007 | Singh et al. | |
| 2008/0121811 A1 | 5/2008 | Horsky et al. | |
| 2008/0142039 A1 | 6/2008 | Chen et al. | |
| 2008/0223409 A1 | 9/2008 | Horsky et al. | |
| 2009/0095713 A1 | 4/2009 | Dimeo, Jr. et al. | |
| 2010/0022095 A1 | 1/2010 | Wu et al. | |

FOREIGN PATENT DOCUMENTS

| | | | |
|---|---|---|---|
| EP | 0945892 A2 | 9/1999 | |
| EP | 1061550 A2 | 12/2000 | |
| GB | 2 412 488 A | 3/2004 | |
| JP | 1-265511 A | 10/1989 | |
| JP | 4-333572 A | 11/1992 | |
| JP | 6-77177 A | 3/1994 | |
| JP | 08-055804 A | 2/1996 | |
| JP | 8-232069 A | 9/1996 | |
| JP | 10280151 A * | 10/1998 | |
| JP | 10-317169 A | 12/1998 | |
| JP | 10-332091 A | 12/1998 | |
| JP | 2000222724 A | 8/2000 | |
| JP | 2000-350970 A | 12/2000 | |
| JP | 2004-134741 A | 4/2004 | |
| JP | 2005-533179 A | 11/2005 | |
| WO | 0250884 A1 | 6/2002 | |
| WO | 2004007793 A2 | 1/2004 | |
| WO | 2005059942 A2 | 6/2005 | |
| WO | 2005060602 A2 | 7/2005 | |
| WO | 2005072252 A2 | 8/2005 | |
| WO | 2006047373 A2 | 5/2006 | |
| WO | 2009102762 A2 | 8/2009 | |

OTHER PUBLICATIONS

Arno, J. et al. , "Flourine Gas: Safe Packaging and Application of a Non-Global Warming Gas for Semiconductor Materials Processing ", "Micromagazine", 2000, pp. 1-6, Publisher: SEMI 2000.

Arno, J. et al. , "Safe Flourine Gas Source for Semiconductor Materials Processing ", "Electrochemical Society Proceedings", 2001, pp. 48-58, vol. 2001-6.

Bartlett, Neil, "Xenon hexafluoroplatinate(v) Xe+[PtF sub 6]-", "Proc. Chem. Society", Jun. 1962, p. 218.

Chang, Floy I., et al, "Gas-phase silicon micromachining with xenon difluoride", "Proceedings of SPIE", Sep. 1995, pp. 117-128, vol. 2641.

Chernick, C.L., et al., "Fluorine Compounds of Xenon and Radon ", "Science", Oct. 12, 1962, pp. 136-138, vol. 138, No. 3537.

Vugts, M.J.M., et al, "Si1XeF2 etching: Temperature dependence", "J. Vac. Sci. Technol. A", Sep. 1996, pp. 2766-2774, vol. 14, No. 5.-

(56) References Cited

OTHER PUBLICATIONS

Walther, S. et al., "Ion Sources for Commercial Ion Implanter Applications", "IEEE", 1991, pp. 2088-2092.

Williams, Kirt R., et al., "Etch rates for micromachining processing", "J. Microelectromech. Sys.", Dec. 1996, pp. 256-269, vol. 5, No. 4.
Winters, H.F., et al "The etching of silicon with XeF2 vapor", "Appl. Phys. Lett.", Jan. 1, 1979, pp. 70-73, vol. 34, No. 1.

\* cited by examiner

MASS SPECTRA OF BF2+ REGION, 1st, 5th, 8th AND 11th CYCLES

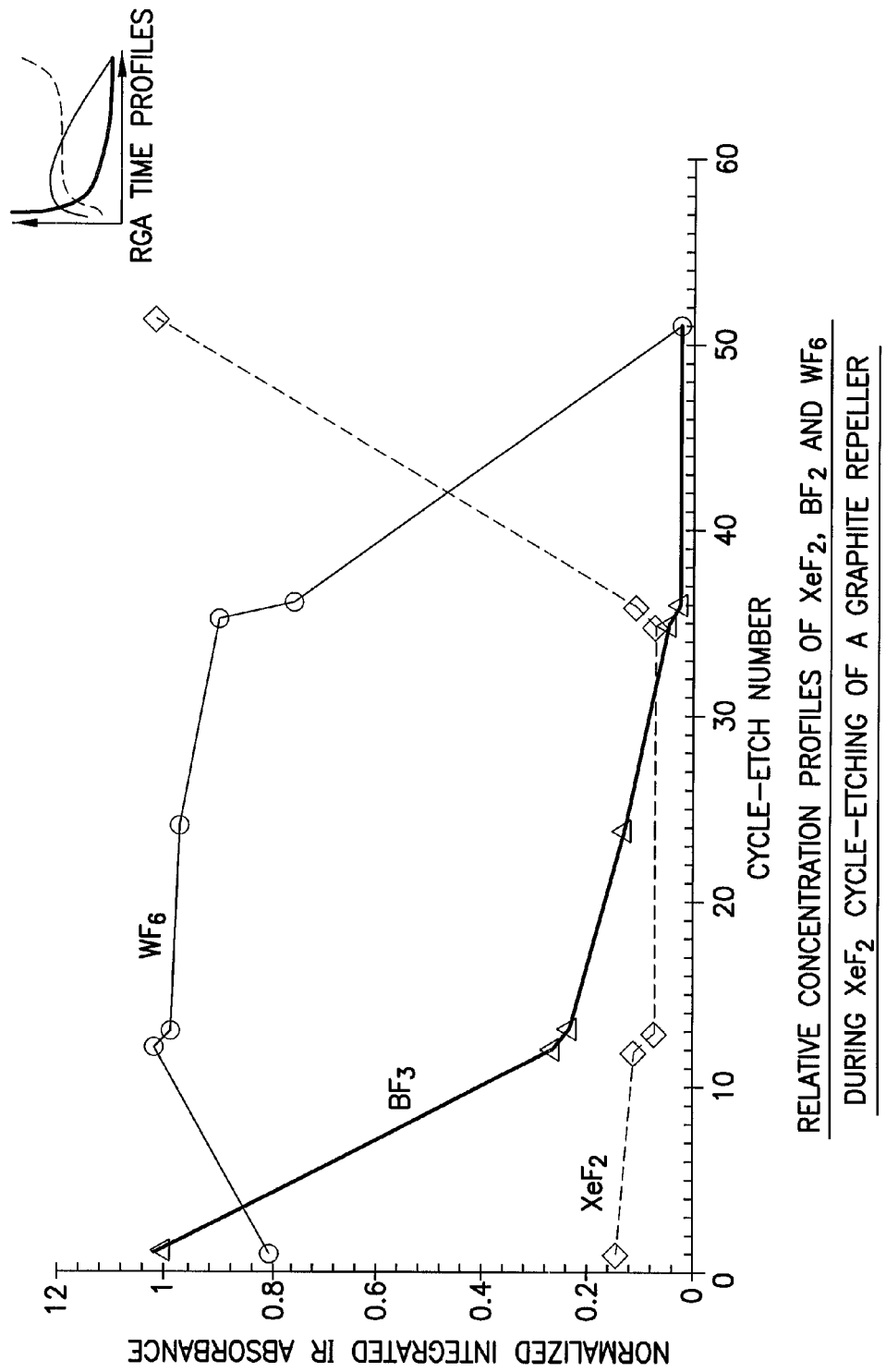

CLEANING OF SEMICONDUCTOR PROCESSING SYSTEMS

STATEMENT OF RELATED APPLICATIONS

This application claims benefit of the following four (4) U.S. Provisional Patent Applications: No. 60/795,216 filed on Apr. 26, 2006; No. 60/832,037 filed on Jul. 20, 2006; No. 60/826,409 filed on Sep. 21, 2006; and No. 60/888,311 filed on Feb. 5, 2007.

FIELD OF THE INVENTION

The present invention relates to cleaning of semiconductor processing systems.

In various specific aspects, the invention relates to methods and apparatus for cleaning one or more components of an ion implantation system used in the fabrication of a microelectronic device. In additional aspects, the invention relates to methods and apparatus for cleaning one or more components utilized in a CVD system used in the fabrication of a microelectronic device.

In one aspect, the present invention relates to the in situ removal of residue from the system and components contained therein by contacting the system and/or components with a gas-phase reactive material for sufficient time and under sufficient conditions to at least partially remove the residue from the components. When the residue and the material from which the components are constructed are different, the gas-phase reactive material is selectively reactive with the residue and minimally reactive with the materials from which the components of the system are constructed. When the residue and the material from which the components are constructed contain common materials, then the gas-phase reactive material may be reactive with both the residue and the component part.

In various specific embodiments, the invention relates to: dynamic cleaning in which a cleaning reagent is flowed continuously from a point of entry through the system and out through an exhaust means, to effect in situ cleaning; static cleaning in which the cleaning vapor is flowed into the system and the system then is maintained in a closed state to allow the vapor to react with the deposited material after which the gaseous products are pumped out of the system; and use of fluorinated xenon compounds, e.g., $XeF_2$, as a vapor supporting a plasma in an ion source.

DESCRIPTION OF THE RELATED ART

Ion implantation is used in integrated circuit fabrication to accurately introduce controlled amounts of dopant impurities into semiconductor wafers and is a crucial process in microelectronic/semiconductor manufacturing. In such implantation systems, an ion source ionizes a desired dopant element gas and the ions are extracted from the source in the form of an ion beam of desired energy. Extraction is achieved by applying a high voltage across suitably shaped extraction electrodes, which incorporate apertures for passage of the extracted beam. The ion beam is then directed at the surface of the workpiece, such as a semiconductor wafer, in order to implant the workpiece with the dopant element. The ions of the beam penetrate the surface of the workpiece to form a region of desired conductivity.

Several types of ion sources are commonly used in commercial ion implantation systems, including the Freeman and Bernas types using thermoelectrodes and powered by an electric arc, a microwave type using a magnetron, indirectly heated cathode sources, and RF plasma sources, all of which typically operate in a vacuum. The ion source generates ions by introducing electrons into a vacuum chamber filled with the dopant gas (commonly referred to as the "feedstock gas"). Collisions of the electrons with dopant atoms and molecules in the gas results in the creation of ionized plasma consisting of positive and negative dopant ions. An extraction electrode with a negative or positive bias will respectively allow the positive or negative ions to pass through the aperture and out of the ion source as a collimated ion beam, which is accelerated towards the workpiece. Feedstock gases include, but are not limited to, $BF_3$, $B_{10}H_{14}$, $B_{18}H_{22}$, $PH_3$, $AsH_3$, $PF_5$, $AsF_5$, $H_2Se$, $N_2$, Ar, $GeF_4$, $SiF_4$, $O_2$, $H_2$, and $GeH_4$.

Presently, there are upwards of 10-15 implantation steps in the fabrication of state of the art devices. Increasing wafer sizes, decreasing critical dimensions, and growing circuit complexity are placing greater demands on ion implant tools, with respect to better process control, the deliverance of high beam currents at low energies, and a decrease in the mean time between failures (MTBF).

The parts of the ion implanter tool that require the most maintenance include: the ion source, which must be serviced after approximately 100 to 300 hours of operation, depending on its operating conditions; the extraction electrodes and the high voltage insulator, which usually require cleaning after a few hundred hours of operation. Additionally, the filament of the system can require replacement after operation.

In the ideal case, all feedstock molecules would be ionized and extracted, but in reality a certain amount of feedstock decomposition occurs, which results in the deposition on and contamination of the ion source region. For example, phosphorous residue (e.g., deriving from use of a feedstock gas such as phosphine) readily deposits on surfaces in the ion source region. The residue can form on low voltage insulators in the ion source, causing electrical short circuits, which can interrupt the arc required to produce thermionic electrons. This phenomenon is generally known as "source glitching," and it is a major contributor to ion beam instability, and may eventually cause premature failure of the source. The residue also forms on the high voltage components of the ion implanter, such as the source insulator or the surfaces of the extraction electrodes, causing energetic high voltage sparking. Such sparks are another contributor to beam instability, and the energy released by these sparks can damage sensitive electronic components, leading to increased equipment failures and poor MTBF.

Additionally, deposits are common on ion source elements such as the filament and the repeller electrode. Such internal deposits are generally composed of arc chamber material, and are most commonly seen when running high plasma power with a fluoride source feedstock in conjunction with an arc chamber constructed of tungsten or molybdenum. While the ion source life expectancy for ion implantation systems using non halide-containing source materials is generally around 100 to 300 hours, with some halide-containing materials such as $GeF_4$, the ion source life can be as low as 10 to 50 hours due to the detrimental effects of internal deposits on source operation.

In addition to the operational difficulties caused by residues in the ion implanter, there are also significant personnel safety issues due to the emission of toxic or corrosive vapors when components are removed for cleaning. The safety issues arise wherever residues are present, but are of particular concern in the ion source region because the ion source is the most frequently maintained component of the ion implanter. To minimize down time, contaminated ion sources are often removed from the implanter at temperatures significantly above room temperature, which increases the emission of vapors and exacerbates the safety issue.

Prior methods of dealing with the above difficulties have included attempts to prevent formation of the deposits and cleaning of the resulting deposits on the extraction electrode and the ion source (i.e. on the extraction electrode, as discussed in published U.S. Patent Application 2006/0272776, published U.S. Patent Application 2006/0272775 and published International Patent Application WO 2005/059942 A2). However, a need for additional processes of cleaning of all elements of an ion implantation system remains.

It would therefore be desirable in the art of ion implantation to provide an ex situ cleaning process with a separate cleaning station whereby contaminated components that have been removed from the implanter can be cleaned safely without any mechanical abrasion which might damage delicate components such as graphite electrodes. It would therefore also be a significant advance in the art of ion implantation to provide an off-line cleaning station that could be used to selectively and non-destructively clean components following removal from the implant system and with minimal down time.

It would also be a significant advance in the art of ion implantation to provide an in situ cleaning process for the effective, selective removal of unwanted residues deposited throughout the implanter, particularly in the ion source region, during implantation. Such in situ cleaning would enhance personnel safety and contribute to stable, uninterrupted operation of the implantation equipment.

In recent years, two new methods of implantation of boron ions have been developed as alternatives to conventional ion implantation. Both of these alternative methods use boron-containing molecules in the absence of any reactive halide species. This may cause significant deposition of boron in the source region, and in-situ cleaning methods would be beneficial. The first alternative method of implantation is plasma immersion ion implantation, in which the wafer is immersed in plasma containing $B^+$ ions that is made from diborane gas ($B_2H_6$) or boron trifluoride ($BF_3$). The second alternative method is implantation of molecular ions created from molecular species such as decaborane ($B_{10}H_{14}$) or octadecaborane ($B_{18}H_{22}$). It would therefore be a significant advance in the art of ion implantation to provide in situ cleaning processes for alternative implantation methods such as plasma immersion and molecular ion implantation.

Chemical vapor deposition (CVD) offers a low-cost, high throughput approach to device manufacturing. Chemical vapor deposition (CVD) is a chemical process that involves a series of chemical reactions to produce a thin layer of solid material on a substrate surface. The process is widely used to fabricate microelectronic devices and products.

In a typical CVD process, a substrate is exposed to one or more relatively volatile precursors (i.e. containing silicon (Si), tungsten (W), titanium (Ti), or tantalum (Ta)) to form complex metal oxides or silicates. The precursors react with the substrate surface to produce a deposit of solid material on such surface. CVD is well-suited to provide uniform coverage of the deposited material on the substrate.

Chemical vapor deposition may occur by a conventional thermal CVD process, which involves supplying reactive gases to a substrate surface where heat induced chemical reactions (homogenous and heterogeneous) take place to produce a desired film. In the alternative, a plasma process may be implemented wherein controlled plasma is formed to decompose and/or energize reactive species to produce the desired film.

Whether utilizing thermal or plasma CVD process, thin films of deposited materials accumulate in the interior of the CVD deposition chamber. As a result, these thin film deposits must be removed periodically because they tend to affect the reproducibility of thin film deposition processes by changing the dimensions of the chamber. Also, the thin film deposits can flake off and contaminate the wafer being processed in the chamber.

Conventional methods used for cleaning semiconductor processing chambers and reactors include wet scrubbing and in situ cleaning.

The wet cleaning method necessitates the need for breaking the processing chamber's vacuum seal, disassembling the chamber and manually wiping down the chamber's interior surfaces. Strong acid solutions are often used to dissolve the deposits on the interior surface of the chamber. Upon completion of the cleaning process, the chamber must be reassembled and resealed.

Inherent problems associated with this approach include the high volumes of hazardous chemicals that must be used in the cleaning process. Additionally, the manual breakdown of the processing system and subsequent reassembly is labor-intensive, time-consuming, increases wear on the processing chamber components, and may leave residual contamination within the chamber.

An in situ cleaning process is performed without disassembly of the process chamber. Typically, either plasma is generated for a dry etching process or a gaseous agent is flowed through the process chamber to remove accumulated films.

Plasmaless or dry cleaning processes using chlorine trifluoride ($ClF_3$) and other fluorine radicals and/or fluorine-containing interhalogens (i.e. $CF_4$, $NF_3$, $C_2F_6$, $C_3F_8$, $SF_6$) have recently proved to be effective in removing solid residues from semiconductor processing chamber. $ClF_3$ and other fluorine radicals and/or fluorine-containing interhalogens react with such solid residues to form volatile reaction products, which can be readily removed from the processing chamber by vacuum or other devices. See Y. Saito et al., "Plasmaless Cleaning Process of Silicon Surface Using Chlorine Trifluoride", APPLIED PHYSICS LETTERS, vol. 56 (8), pp. 1119-1121 (1990); also see D. E. Ibbotson et al., "Plasmaless Dry Etching of Silicon with Fluorine-Containing Compounds", JOURNAL OF APPLIED PHYSICS, vol. 56 (10), pp. 2939-2942 (1984).

U.S. Pat. No. 4,498,953 describes an in-situ cleaning method in which an interhalogen, such as $BrF_5$, $BrF_3$, $ClF_3$, or $IF_5$ is continuously flowed through the processing chamber while maintaining a predetermined pressure within the chamber. At the end of the treatment, the flow of the interhalogen gas is terminated. However, a significant amount of hazardous material is moved through the system. Clearly, the high volume of material utilized in this method not only increases the cost of production but presents ancillary costs relating to the disposal of hazardous materials.

A similar problem exists in the process disclosed in U.S. Pat. No. 5,565,038 wherein a continuous flow of an interhalogen gas is introduced into a processing chamber to be used as a cleaning agent. Again, the flow of reactive gas is ongoing, and not terminated until the film removal is completed. Still further, as in the prior art cited above, this method is inherently problematic because of the large quantities of hazardous materials that are utilized, and the associated costs to the manufacturer and/or the environment. Additionally, the continuous flow cleaning process is performed under very low pressure and cleaning efficiency is reduced under such condition. See also U.S. Pat. No. 6,534,007.

Other known methods for removing deposit buildup in processing chambers utilize $NF_3$, including the types used in thermal CVD processes such as, vertical tubes. However, very high temperatures are required to crack $NF_3$, to release the reactive fluorine ions. If these temperatures are not reached and/or maintained, hazardous $NF_3$ is exhausted to the surrounding environment. In addition, the poor reaction selectivity of fluorine ions results in unwanted etching of the quartz reactor. Still further, depending on the shape of the processing chamber, uniform cleaning is not always predictable or accomplished.

The use of fluorine radicals or fluorine-containing interhalogens for cleaning of semiconductor processing equipment, however, faces practical problems of implementation and commercial viability. For example, the supply of fluorine radicals or fluorine-containing interhalogens, including $ClF_3$, are highly corrosive, and issues such as compatibility of storage and dispensing vessels, and associated process piping and componentry, require substantial attention and costly solutions.

Further, interhalogen compounds are extremely irritating to human respiratory tracts. The threshold level of human tolerance of $ClF_3$ vapor is as low as 100 ppb, and an LC 50, 1 hour of 300 ppm. Inadvertent leakage of such highly toxic fluid is therefore highly hazardous to human health. Further, most interhalogen compounds are liquids at room temperature and are transported in the liquid phase, and the inherent high density of liquids over gases accentuates many of the risks associated with transporting such compounds.

Thus, it would be a significant advance in the art to provide a system and method that generates cleaning agents with minimized risk of exposure to these compounds and that overcomes problems otherwise associated with transporting and storing highly reactive fluorine radicals and fluorine-containing interhalogens.

As such, it would be desirable in the art of CVD to provide ex situ and in situ cleaning processes and cleaning agents useful in such processes.

SUMMARY OF THE INVENTION

The present invention relates generally to ion implanter and CVD cleaning systems and methods, e.g., for cleaning internal components of a semiconductor processing system, and compositions usefully employed for such cleaning.

Specifically, the present invention in a broad aspect relates to the in situ cleaning of a component of an ion implanter using a gas-phase reactive material, wherein the gas-phase reactive material is contacted with the residue for sufficient time and under sufficient conditions to at least partially remove the residue from at least one component.

In one aspect, the present invention relates to a method of cleaning at least one component of a semiconductor processing system, the method comprising:
 (a) introducing a gas-phase reactive material from a cleaning composition source container into at least a portion of the system comprising the at least one component to be cleaned;
 (b) terminating introduction of the gas-phase reactive material into the system upon attainment of a predetermined characteristic within the system; and
 (c) reacting the gas-phase reactive material with a residue in the system for a sufficient time to at least partially remove the residue from the at least one component to be cleaned.

The gas-phase reactive material reacts selectively with the residue on the at least one component. Predetermined characteristics for determination of termination of introduction of gas-phase reactive material may include, as discussed more fully below, temperature, pressure, measurement of a species, etc.

In another aspect, the present invention relates to a method of cleaning an ion source region of a semiconductor processing system, said method comprising:
 (a) introducing a gas-phase material from a cleaning composition source container into a vacuum chamber of the ion source region;
 (b) terminating introduction of the gas-phase material into the vacuum chamber upon attainment of a predetermined pressure within the vacuum chamber;
 (c) dissociating the gas-phase reactive material into reactive halide species in the vacuum chamber using a plasma in said vacuum chamber; and
 (d) reacting the reactive halide species with a residue in the vacuum chamber for a sufficient time to at least partially remove the residue from the vacuum chamber.

In yet another aspect, the present invention relates to an apparatus for cleaning at least one component of a semiconductor processing system, said apparatus comprising:
 (a) a cleaning composition source having a gas-phase reactive material disposed therein, wherein the cleaning composition source is communicatively connected to, and is situated upstream of the at least one component to be cleaned; and
 (b) a valve between the cleaning composition source and the at least one component to be cleaned.

A further aspect of the present invention relates to a method of ex situ cleaning of at least one component of a semiconductor processing system, said method comprising:
 (a) positioning the component in an ex situ vacuum chamber;
 (b) introducing a gas-phase reactive material from a cleaning composition source container into the ex situ vacuum chamber;
 (c) terminating introduction of the gas-phase reactive material into the vacuum chamber upon attainment of a predetermined characteristic in the vacuum chamber; and
 (d) reacting the gas-phase reactive material with a residue in the vacuum chamber for a sufficient time to at least partially remove the residue from the at least one component contained therein;
 wherein the gas-phase reactive material reacts selectively with the residue on the at least one component.

A further aspect of the invention relates to a method of cleaning one or more components of an ion implantation system for at least partial removal of ionization-related deposits from said one or more components, said method comprising contacting said one or more components with a cleaning composition comprising a gas-phase reactive material, under conditions enabling reaction of the gas-phase reactive material with the deposits to effect said at least partial removal.

In another aspect the invention provides a method of cleaning at least one component of a semiconductor manufacturing tool, by continuously flowing an etchant gas from an etchant container into a vacuum chamber of the semiconductor manufacturing tool and reacting the etchant gas with a residue in the vacuum chamber to at least partially remove the residue from the interior of the vacuum chamber or at least one component contained therein; and regulating the partial pressure of the etchant gas in the chamber by use of a control valve on an output of the chamber.

In still another aspect the invention provides a method of ex situ cleaning of at least one component of a semiconductor manufacturing tool by positioning the component in an ex situ vacuum chamber, continuously flowing an etchant gas from an etchant container into the ex situ vacuum chamber, reacting the etchant gas with a residue in the vacuum chamber to at least partially remove the residue from the at least one component contained therein and regulating the partial pressure of the etchant gas by use of a control valve in an output of the container.

Another aspect of the invention relates to an ion implantation and cleaning assembly, comprising an ion implantation system including one or more components accumulating ionization-related deposits thereon during ion implantation processing in the system, and a cleaning assembly including a cleaning composition source containing a cleaning composition including a gaseous halide reactive with the deposits to effect at least partial removal thereof from said one or more components under cleaning conditions involving contact of the cleaning composition with the deposits, flow circuitry adapted to transport the cleaning composition from the cleaning composition source to said one or more components for contacting therewith under the cleaning conditions, and flow componentry adapted to control flow of the cleaning composition through the flow circuitry during the cleaning conditions to effect said at least partial removal of the deposits from the one or more components.

In another aspect, the invention relates to a method of increasing stability of an ion source used to generate plasma, e.g. $BF_3$, $AsH_3$, $PH_3$, $GeF_4$, $SiF_4$, or $H_2Se$, said method comprising cleaning said ion source with a gaseous halide plasma, e.g., $XeF_2$ plasma.

A further aspect of the invention relates to a method of removing a deposit from a substrate having such deposit thereon, wherein said deposit includes at least one of boron, silicon, arsenic, phosphorus, germanium, tungsten, molybdenum, selenium, antimony, indium, tantalum, and carbon, such method comprising contacting the substrate with gas-phase reactive material comprising a gas such as $XeF_2$, $XeF_4$, $XeF_6$, $NF_3$, $IF_5$, $IF_7$, $SF_6$, $C_2F_6$, $F_2$, $CF_4$, $KrF_2$, $Cl_2$, $HCl$, $ClF_3$, $ClO_2$, $N_2F_4$, $N_2F_2$, $N_3F$, $NFH_2$, $NH_2F$, $HOBr$, $Br_2$, compounds of the formula $C_xF_y$, such as $C_3F_6$, $C_3F_8$, $C_4F_8$, and $C_5F_8$, compounds of the formula $C_xH_yF_z$, such as $CHF_3$, $CH_2F_2$, $CH_3F$, $C_2HF_5$, $C_2H_2F_4$, $C_2H_3F_3$, $C_2H_4F_2$, and $C_2H_5F$, $COF_2$, $HF$, or organochlorides such as $COCl_2$, $CCl_4$, $CHCl_3$, $CH_2Cl_2$, and $CH_3Cl$, for sufficient time to at least partially remove said deposit from the substrate.

Yet another aspect of the invention relates to an ion implantation method, comprising generating a plasma in an arc chamber of an ion implantation system from a dopant source gas flowed through the arc chamber to form dopant source ions for implantation, and during at least part of the time during which the dopant source gas is flowed through the arc chamber, flowing cleaning gas through the arc chamber concurrently with the dopant source gas, to effect cleaning in the ion implantation system, wherein the cleaning gas comprises gaseous halide.

Another aspect of the invention relates to a method of forming a doped silicon substrate, comprising implantation of dopant ions in a silicon substrate, and additionally implanting $Xe^+$ ions in said substrate.

In a further aspect the present invention relates to a method of cleaning an ion source, said method comprising generating a gaseous halide plasma, e.g., an $XeF_2$ plasma, in the ion source, to produce $Xe^+$ ions effective for sputter cleaning of the source and $Xe^+$ ions effective for sputter cleaning of components downstream of the ion source.

The invention in another aspect relates to a method of cleaning an ion source between successive ion generation processes involving different dopant source gases, in which such method comprises flowing a gaseous halide compound such as $XeF_2$ and the like through the ion source between such processes with or without a plasma (i.e., under source cold or source hot conditions in the absence or in the presence of plasma generation, between successive ion generation processes involving different dopant source gases).

Still another aspect of the present invention relates to a method of cleaning an ion source between successive ion generation processes involving the same dopant source gas, in which such method comprises flowing a gaseous halide compound, e.g., $XeF_2$, through the ion source between such processes with or without a plasma.

Specifically, the present invention in another broad aspect relates to the cleaning of a CVD system or one or more components thereof, using a gas-phase reactive material, wherein the gas-phase reactive material is contacted with the residue in the CVD system for sufficient time and under sufficient conditions to at least partially remove the residue from one or more components in the CVD system.

In one aspect, the present invention relates to a method of cleaning at least one component of a semiconductor processing system, said method comprising:

(a) introducing a gas-phase reactive material from a cleaning composition source container into a reactor of the semiconductor processing system;

(b) terminating introduction of the gas-phase reactive material into the reactor upon attainment of a predetermined characteristic in the reactor; and (c) reacting the gas-phase reactive material with a residue in the reactor for a sufficient time to at least partially remove the residue from the interior of the reactor or at least one component contained therein;

wherein the gas-phase reactive material reacts selectively with the residue.

Another aspect of the invention relates to a deposition and cleaning assembly, comprising a CVD system including one or more components accumulating deposition-related deposits thereon during deposition processing in the system, and a cleaning assembly including a cleaning composition source containing a cleaning composition including a gaseous halide reactive with the deposits to effect at least partial removal thereof from said one or more components under cleaning conditions involving contact of the cleaning composition with the deposits, flow circuitry adapted to transport the cleaning composition from the cleaning composition source to said one or more components for contacting therewith under the cleaning conditions, and flow componentry adapted to control flow of the cleaning composition through the flow circuitry during the cleaning conditions to effect said at least partial removal of the deposits from the one or more components.

Yet another aspect of the invention relates to a CVD method, comprising forming a solid film on a substrate from a precursor provided to the reactor, and during at least part of the time during which the precursor is provided to the reactor, flowing cleaning gas through the reactor concurrently with the precursor, to effect cleaning in the CVD system, wherein the cleaning gas comprises gaseous halide.

The invention in another aspect relates to a method of cleaning a CVD system between successive deposition processes involving different precursors, in which such method comprises flowing a gaseous halide compound through the source between such processes.

Still another aspect of the present invention relates to a method of cleaning a CVD system between successive deposition processes involving the same precursors, in which such method comprises flowing a gaseous halide compound through the source between such processes.

A further aspect relates to a process for extending the life of an ion source comprising cleaning the ion source or a component thereof, with a gas-phase reactive material comprising at least one gas selected from the group consisting of $XeF_2$, $XeF_4$, $XeF_6$, $NF_3$, $IF_5$, $IF_7$, $KrF_2$, $SF_6$, $C_2F_6$, $F_2$, $CF_4$, $Cl_2$, HCl, $ClF_3$, $ClO_2$, $N_2F_4$, $N_2F_2$, $N_3F$, $NFH_2$, $NH_2F$, HOBr, $Br_2$, $C_3F_8$, $C_4F_8$, $C_5F_8$, $CHF_3$, $CH_2F_2$, $CH_3F$, $COF_2$, HF, $C_2HF_5$, $C_2H_2F_4$, $C_2H_3F_3$, $C_2H_4F_2$, $C_2H_5F$, $C_3F_6$, $COCl_2$, $CCl_4$, $CHCl_3$, $CH_2Cl_2$, and $CH_3Cl$.

Another aspect of the invention relates to a process for extending the MTBF of a process tool comprising cleaning the process tool or a component thereof, with a gas-phase reactive material comprising at least one gas selected from the group consisting of $XeF_2$, $XeF_4$, $XeF_6$, $NF_3$, $IF_5$, $IF_7$, $KrF_2$, $SF_6$, $C_2F_6$, $F_2$, $CF_4$, $Cl_2$, HCl, $ClF_3$, $ClO_2$, $N_2F_4$, $N_2F_2$, $N_3F$, $NFH_2$, $NH_2F$, HOBr, $Br_2$, $C_3F_8$, $C_4F_8$, $C_5F_8$, $CHF_3$, $CH_2F_2$, $CH_3F$, $COF_2$, HF, $C_2HF_5$, $C_2H_2F_4$, $C_2H_3F_3$, $C_2H_4F_2$, $C_2H_5F$, $C_3F_6$, $COCl_2$, $CCl_4$, $CHCl_3$, $CH_2Cl_2$, and $CH_3Cl$.

Other aspects, features and embodiments of the invention will be more fully apparent from the ensuing disclosure and appended claims.

BRIEF DESCRIPTION OF THE DRAWINGS

FIG. 19 is a graph of the relative concentration profiles of $BF_3$, $XeF_2$ and $WF_6$ in the $XeF_2$ cleaning of a graphite repeller plate.

DETAILED DESCRIPTION OF THE INVENTION

Figure 1:
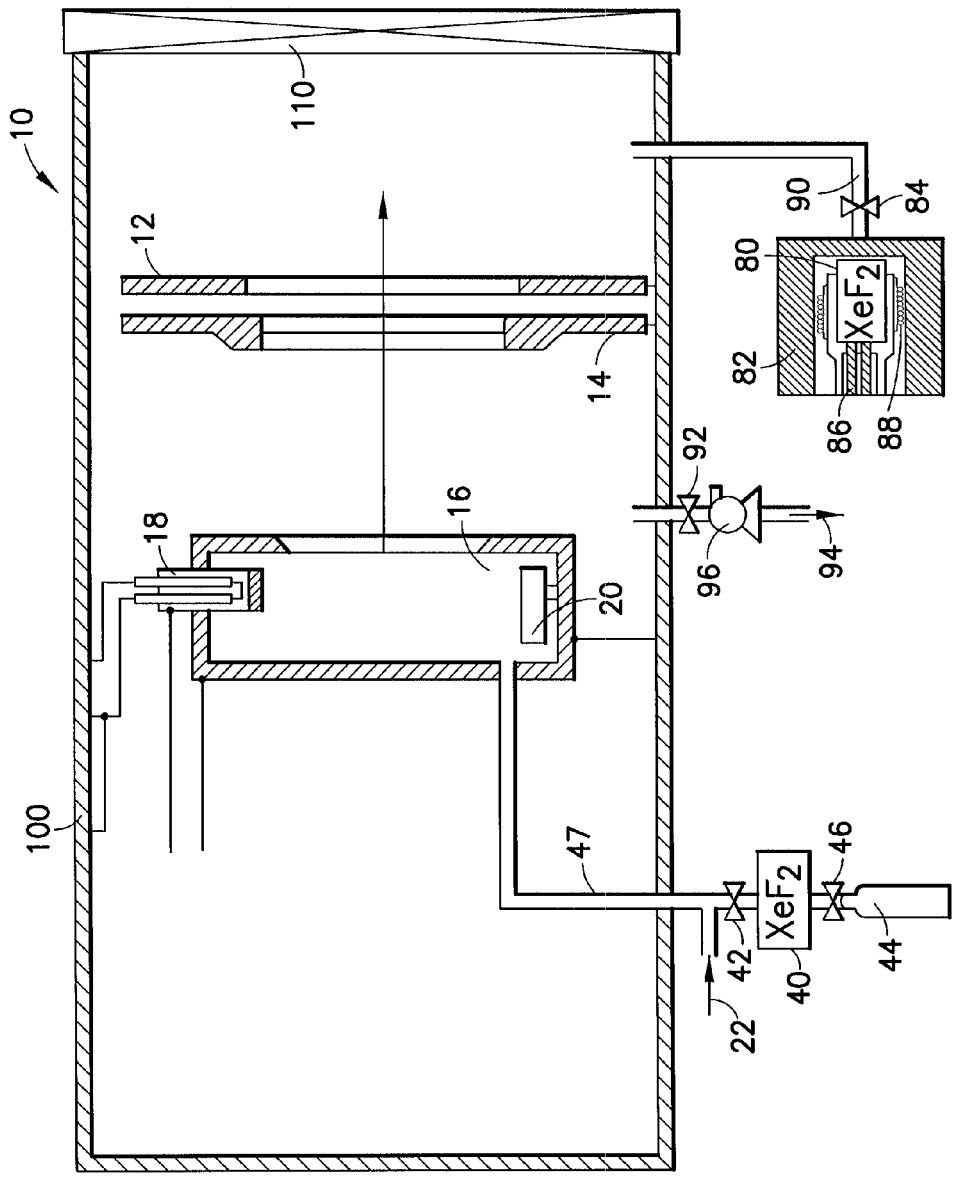
FIG. 1 is a schematic representation of an ion implanter system incorporating static mode cleaning according to one embodiment of the invention.

The present invention relates to method and apparatus for removal of deposits from substrates, in which the substrate is contacted with a cleaning composition including a gas-phase reactive material. The term "gas-phase reactive material" as used herein is intended to be broadly construed as a material comprising halide compounds and complexes, in gaseous or vapor form, ionic and plasma forms of such compounds and complexes, and elements and ions derived from such compounds, complexes and ionic and plasma forms. A gas-phase reactive material utilized in the invention may also be variously referred to, without limitation, as a "gas-phase reactive composition," a "cleaning agent," a "cleaning gas," an "etchant gas," a "gaseous halide," a "gaseous cleaning agent," a "reactive halide," a "cleaning compound," a "cleaning composition," a "cleaning vapor," an "etchant vapor" or any combination of terms thereof.

The invention contemplates the cleaning of semiconductor processing systems and other substrates and apparatus that are susceptible to formation of deposits thereon during their normal processing operation.

Ion Implantation Systems

The invention contemplates in one embodiment a method of cleaning one or more components of an ion implantation system for at least partial removal of ionization-related deposits from said one or more components. Such method includes contacting such one or more components with a cleaning composition comprising a gas-phase reactive material, under conditions enabling reaction of the gas-phase reactive material with the deposits to effect said at least partial removal.

In addition to the ionization-related deposits discussed above, resulting from feedstock gases, it has also been found by the present inventors that deposits or residue formed within an ion implantation system may result from reactivity of feedstock gases with the material from which the system components are constructed. For example, the vacuum chamber of the ion implantation system may be constructed utilizing stainless steel or aluminum. System components within the vacuum chamber may also be constructed utilizing graphite (e.g. standard or vitreous), insulator materials (e.g. boron nitride) and/or sealant materials such as teflon, Kel-F, vespel, Viton™, Buna-n, silicon, etc. Other system components, such as ceramics, may be constructed from materials such as epoxy with lead oxide suspended therein, aluminum nitride, aluminum oxide, silicon dioxide, boron nitride, Peek™, Delrin™, Teflon™, and/or Vespel™.

The ion source may be constructed of tungsten, graphite, molybdenum or tantalum, sometimes with minor amounts of copper and silver. The ion source arc chamber may be usually constructed of tungsten or molybdenum, or with a graphite body lined with tungsten or molybdenum. In such a situation, a fluoride source feed material, e.g. $BF_3$, $GeF_4$ or $SiF_4$, reacts with the material of the arc chamber, e.g. tungsten or molybdenum from the chamber or the lining of the chamber at the operation temperature to form an intermediate byproduct and the resulting byproduct migrates to another location at another temperature, where the byproduct is decomposed, depositing tungsten or molybdenum and liberating the fluorine. The present invention therefore contemplates in another embodiment a method of cleaning one or more components of an ion implantation system for at least partial removal of ionization-related deposits that are the same as the material of the arc chamber, from said one or more components.

As used herein "ionization-related deposits" refers to any deposit of material that may interfere with normal operation of the ion implantation system. The ionization-related deposits with which the gaseous halide is reactive can be of any suitable type, including ionization-related deposits such as those that form and accumulate in an ion source or other ionization process equipment. The deposited material may include, comprise, consist essentially of or consist of silicon, boron, phosphorous, germanium, arsenic, tungsten, molybdenum, selenium, antimony, indium or tantalum.

It is known that deposited dopant material in the ion source arc chamber and extraction electrodes can flake and form small particles. These particles can be transported within an ion beam, for example a beam of dopant ions being implanted into a wafer. In some cases such transported particles can reach the wafer, causing a significant increase in particle contamination on the wafer and resulting in a serious reduction in the yield of devices being manufactured on the wafer. It is a purpose of the invention to remove deposits of dopant material before they are able to form flakes and particles, thereby reducing particles on the wafer and increasing the yield of semiconductor devices.

The gas-phase reactive material used in such method may comprise any suitable halide, e.g., a halide selected from the group consisting of $XeF_2$, $XeF_4$, $XeF_6$, $NF_3$, $IF_5$, $IF_7$, $SF_6$, $C_2F_6$, $F_2$, $CF_4$, $KrF_2$, $Cl_2$, $HCl$, $ClF_3$, $ClO_2$, $N_2F_4$, $N_2F_2$, $N_3F$, $NFH_2$, $NH_2F$, $HOBr$, $Br_2$, $C_3F_8$, $C_4F_8$, $C_5F_8$, $CHF_3$, $CH_2F_2$, $CH_3F$, $COF_2$, $HF$, $C_2HF_5$, $C_2H_2F_4$, $C_2H_3F_3$, $C_2H_4F_2$, $C_2H_5F$, $C_3F_6$, and organochlorides such as $COCl_2$, $CCl_4$, $CHCl_3$, $CH_2Cl_2$, $CH_3Cl$, $HOBr$ and $Br_2$. In one embodiment the gas-phase reactive material includes a halide selected from the group consisting of: $NF_3$, $CF_4$, $KrF_2$, $Cl_2$, $HCl$, $ClF_3$, $ClO_2$, $N_2F_4$, $N_2F_2$, $N_3F$, $NFH_2$, $NH_2F$, $HOBr$, $Br_2$, $C_3F_8$, $C_4F_8$, $C_5F_8$, $CHF_3$, $CH_2F_2$, $CH_3F$, $COF_2$, $HF$, $C_2HF_5$, $C_2H_2F_4$, $C_2H_3F_3$, $C_2H_4F_2$, $C_2H_5F$, $C_3F_6$, and organochlorides such as $COCl_2$, $CCl_4$, $CHCl_3$, $CH_2Cl_2$, $CH_3Cl$, $HOBr$ and $Br_2$.

In another embodiment, the gas-phase reactive material is co-administered with a "cleaning enhancement agent" or "co-reactant" that will increase the volatility of the gas-phase reactive material, resulting in removal of more deposits than with the gas-phase reactive material without the cleaning enhancement agent or co-reactant. For example, removal of iridium deposits by $XeF_2$ can be enhanced by co-administration of Lewis bases and electron back-bonding species; and/or selected from the group consisting of carbon monoxide, trifluorophosphine, and trialkylphosphines, as in U.S. Pat. No. 6,709,610 and U.S. Pat. No. 6,254,792.

The conditions enabling reaction of the gas-phase reactive material and the deposits may include any suitable conditions of temperature, pressure, flow rate, composition, etc. under which the gas-phase reactive material contacts and chemically interacts with the material sought to be removed from a substrate so as to remove such material.

Examples of various conditions that may be employed include ambient temperature, temperature in excess of ambient temperature, presence of plasma, absence of plasma, sub-atmospheric pressure, atmospheric pressure, etc. Specific temperatures for such gas-phase reactive material contacting can be in a range of from about 0° C. to about 1000° C. The contacting can involve delivery of the gas-phase reactive material in a carrier gas, or in a neat form, or in admixture with a further cleaning agent, dopant, etc. The gas-phase reactive material for chemical reaction with deposits that are at ambient temperature may be heated to increase the kinetics of the reaction.

The reaction between the gas-phase reactive material and the deposits may be monitored and/or regulated by observation of varying characteristics of the reaction. Such characteristics may include pressure, time, temperature, concentration, presence of a particular species, rate of pressure change, rate of concentration change of a particular species), etc. Accordingly, termination of the introduction of the gas-phase reactive material into the system may be performed upon attainment of a predetermined characteristic of the reaction, such as reaching a predetermined pressure in the vacuum chamber, passage of a predetermined amount of time, attainment of a predetermined temperature, attainment of a predetermined concentration of an element within the system, presence of a particular by-product, reaction product or other species within the system.

In one embodiment, the deposit includes material formed from reaction with a component of the ion implantation system. For example, the deposit to be removed may comprise tungsten from reaction with the arc chamber of the system. In cleaning such deposits, the cleaning method is dependent on the temperature gradient of the system. Fluorine from the feed material may react with the arc chamber at one temperature to form $WF_6$ by the following reactions (1) or (2).

$$3F_2(g) + W(s) \rightarrow WF_6(g) \tag{1}$$

$$6F(g) + W(s) \rightarrow WF_6(g) \tag{2}$$

The $WF_6$ then migrates to another location in the system, generally a location with a higher temperature, where the $WF_6$ is decomposed, the tungsten is deposited and the fluorine is released. Therefore, for cleaning of such tungsten deposits, the temperature of the components containing the deposits must be lowered from the temperature at which the deposits formed. In another example, if there are boron deposits in the arc chamber or additional metal parts, small amounts of $BF_3$ and other metal fluorides (e.g. Molybdenum screws that would cause $MoF_6$ to form) might also be formed.

The contacting may be conducted with monitoring of total pressure change during the contacting, such that the contacting is terminated when the pressure change goes to zero. Alternatively the contacting may be conducted with monitoring of partial pressure of the gas-phase reactive material, or reactants deriving therefrom or reaction products produced in the contacting, and terminating the contacting when the partial pressure reaches a predetermined value, i.e., an end point. Such end point monitor can be of any suitable type, e.g., comprising an end point monitoring system of the type more fully described in U.S. patent application Ser. No. 10/273,036 (US 2004/0074285) for "Apparatus and Process for Sensing Fluoro Species in Semiconductor Processing Systems," in U.S. Pat. No. 6,534,007 "Method and Apparatus for Detecting the Endpoint of a Chamber Cleaning," U.S. patent application Ser. No. 10/784,606 (US 2004/0163444) for "Nickel-coated free-standing silicon carbide structure for sensing fluoro or halogen species in semiconductor processing systems, and processes of making and using same," U.S. patent application Ser. No. 10/784,750 (US 2004/0163445) for "Apparatus and process for sensing fluoro species in semiconductor processing systems," and U.S. patent application Ser. No. 10/758,825 (U.S. Pat. No. 7,228,724) for "Apparatus and process for sensing target gas species in semiconductor processing systems," all incorporated by reference in their entirety. An additional exemplary monitor would include MEMS-based gas sensing capability for determining the endpoints of semiconductor chamber cleaning processes, as described in U.S. Pat. No. 6,534,007 for "Apparatus and process for sensing fluoro species in semiconductor processing systems," hereby incorporated by reference. That invention provided for MEMS-based (microelectromechanical) sensing that had not been previously viable, due to the need for that thin film materials ("sensing films") that have a measurable response to heavily fluorinated gases employed in semiconductor chamber cleaning, and (2) the integration and packaging of such sensing films in a reliable form that will survive the harsh environments of such heavily fluorinated gases.

In another embodiment the contacting may be conducted by controllable flow of the gas-phase reactive material with components of the system that allow regulation of the partial pressure of gas-phase reactive material and therefore control of the reaction rate. In still another embodiment, a continuous, pre-determined flow of the gas-phase reactive material allows a wide range of process conditions, such as flow and temperature, to be obtained in the system.

A specific embodiment of the invention relates to a method of removing a deposit from a substrate having such deposit thereon, wherein such deposit includes at least one of boron, silicon, arsenic, phosphorus, germanium tungsten, molybdenum, selenium, antimony, indium, tantalum and carbon. The method includes contacting the substrate with a gas-phase reactive material for sufficient time to at least partially remove the deposit from the substrate.

Concerning the use of fluorinated xenon compounds as cleaning agents and plasma source reagents in the practice of the present invention, the fluorinated xenon compound can include any number of fluorine atoms. However, it is noted that a high ratio of F to Xe is believed to allow for faster and more efficient cleaning. Higher vapor pressures aid in the delivery of more material, as higher vapor pressures will increase delivery rates of the cleaning agent. In one embodiment, xenon hexafluoride is employed as a cleaning agent or plasma source reagent. Although $XeF_6$ vapor pressure at room temperature is approximately seven times higher than that of $XeF_2$, $XeF_6$, as well as $XeF_4$, is very reactive with water. $XeF_6$ is most advantageously employed in cleaning environments not involving the presence or generation of water, hydrocarbons, hydrogen or reducing agents. However, when cleaning compounds with a lower vapor pressure are used, adjustments may be made to the flow circuitry to avoid pressure drops in the flow path and maintain high delivery rates of the cleaning agent.

Gas-phase reactive materials utilized as cleaning agents in the practice of the invention may comprise, but are not limited to $XeF_2$, $XeF_4$, $XeF_6$, $NF_3$, $F_2$, $SF_6$, $C_2F_6$, $CF_4$, $IF_5$, $IF_7$, $KrF_2$, $Cl_2$, $HCl$, $ClF_3$, $ClO_2$, $N_2F_4$, $N_2F_2$, $N_3F$, $NFH_2$, $NH_2F$, $HOBr$, $Br_2$, $C_3F_8$, $C_4F_8$, $C_5F_8$, $CHF_3$, $CH_2F_2$, $CH_3F$, $COF_2$, $HF$, $C_2HF_5$, $C_2H_2F_4$, $C_2H_3F_3$, $C_2H_4F_2$, $C_2H_5F$, $C_3F_6$, and organochlorides such as $COCl_2$, $CCl_4$, $CHCl_3$, $CH_2Cl_2$, and $CH_3Cl$.

Apparatus to effectuate the methods of the invention may be constructed and arranged in any suitable manner to accommodate the cleaning with the gas-phase reactive material. In one embodiment, the invention provides an ion implantation and cleaning assembly, comprising (i) an ion implantation system including one or more components accumulating ionization-related deposits thereon during ion implantation processing in the system, (ii) a cleaning assembly including a cleaning composition source containing a cleaning composition including a gas-phase reactive halide reactive with the deposits to effect at least partial removal thereof from the one or more components under cleaning conditions involving contact of the cleaning composition with the deposits, (iii) flow circuitry adapted to transport the cleaning composition from the cleaning composition source to the one or more components for contacting therewith under the cleaning conditions, and (iv) flow componentry adapted to control flow of the cleaning composition through the flow circuitry during the cleaning conditions to effect the at least partial removal of the deposits from the one or more components.

The flow componentry in the above-described assembly can be of any suitable type, including for example valves, valve actuators, pumps, mass flow controllers, pressure gauges, residual gas analyzers, central processing units, membranes, etc.

Such flow componentry is adapted to operate under the specific cleaning conditions employed.

The one or more components in the assembly accumulating ionization-related deposits thereon during ion implantation processing in the system, can be of any suitable type, e.g., vacuum chambers, arc chambers, electrodes, filaments, high voltage bushings, magnet waveguides, wafer handling components, clamp rings, wheels, discs, etc. In one embodiment, the component is not a vacuum chamber of a component contained therein.

The cleaning composition source may comprise a material storage and dispensing package containing the cleaning composition. The material storage and dispensing package includes a vessel that may, for example, be of generally cylindrical shape, defining an interior volume therein. In this specific embodiment, the cleaning composition may be a solid at ambient temperature conditions and such cleaning composition may be supported on an enhanced surface area within the vessel. Such an enhanced surface area may include structures therein, such as trays, described in U.S. Pat. No. 6,921,062, or porous inert foams, e.g., of anodized aluminum or nickel foam, stainless steel, nickel, bronze, etc., to provide a consistent rate of evaporation of the cleaning material to provide sufficient vapor pressure for the dispensing an ionizing steps of the associated cleaning processes. Where trays are utilized, the cleaning composition may be supported on surfaces of trays having flow passage conduits associated therewith, for flow of vapor upwardly in the vessel to the valve head assembly, for dispensing in use of the vessel.

The flow circuitry in the above-described assembly is adapted to transport the cleaning composition from the cleaning composition source to the arc chamber under said cleaning conditions. Such adaptation may be based upon various properties of the cleaning composition. For example, high conductance may be used to avoid unnecessary pressure drops in the flow path when the cleaning composition has a low vapor pressure. Methods of maximizing flow conductance and minimizing flow constriction are well known in the art.

The ionization-related deposits can include material deposited during generation of dopant ions, e.g., boron, phosphorus, arsenic, germanium, silicon, molybdenum, tungsten, selenium, antimony, indium, tantalum, etc.

In all cleaning methods of the invention, the cleaning may optionally be coupled with additional methods and apparatus for extending the lifetime of the ion implantation system, in particular the ion source. Such may include modification of an ion implantation system utilized in the invention to accommodate the selection of substrate, deposits formed and/or gas-phase reactive material. System apparatus modifications may include, but are not limited to, inclusion of: extraction electrodes with an active thermal control system, an actively heated extraction electrode which reduces the frequency/occurrence of electrical discharges, extraction electrodes comprising metals, preferably aluminum, molybdenum or alumina ($Al_2O_3$), a remote plasma source, association of the extraction electrode with a heater, association of the extraction electrode with a cooling device, a smooth, featureless extraction electrode, a plasma chamber arranged to receive a source gas capable of being disassociated by plasma to produce a flow of reactive gas through a chamber outlet and a conduit for transporting the reactive gas to the ionization chamber, a temperature detector designed to detect substantial termination of an exothermic reaction of the reactive gas with contamination on a surface of the system, protection of a component within the system susceptible to harm by the gas-phase reactive material (such protection may include provision of a shield around the component, preferable impermeable to the gas-phase reactive material, in one embodiment comprising a flow of inert gas, such as argon), and/or utilizing system components comprising aluminum or alumina.

Methods to extend the lifetime of the apparatus may include, but are not limited to: actively heating an extraction electrode to reduce the frequency and occurrence of electrical discharges, heating an extraction electrode above the condensation temperature of source materials to an ion source, actively controlling the temperature of an extraction electrode adapted to the type of ion source (such temperature might include heating or cooling the electrode, in combination with a heated or cooled operating ion source), and/or maintenance of the extraction electrode at an elevated temperature during extraction. Such additional apparatus modifications and methods are more fully described in U.S. Patent Application Publication No. 2006/0272776 for "Method and Apparatus for Extracting Ions from an Ion Source for Use in Ion Implantation," in U.S. Patent Application Publication No. 2006/0272775 for "Method and Apparatus for Extracting Ions from an Ion Source for Use in Ion Implantation," and International Patent Publication No. WO 2005/059942 A2 for "Method and Apparatus for Extending Equipment Uptime in Ion Implantation," hereby incorporated by reference in their entirety.

The ion implantation system in a specific embodiment includes an arc chamber and a dopant source. In one example, the dopant source may contain $BF_3$ and may be adapted to supply $BF_3$ to the arc chamber. The arc chamber in such embodiment is adapted to generate a dopant plasma therein from dopant supplied to the arc chamber from the dopant source. In one example, the cleaning composition contained in the cleaning composition source includes $XeF_2$. The arc chamber can be adapted to generate an $XeF_2$ plasma therein from $XeF_2$ supplied to the arc chamber from the cleaning composition source in the provision of useful cleaning conditions for cleaning of boron-containing deposits deriving from the boron trifluoride plasma. Alternatively, other dopant sources may be utilized, including $AsH_3$, $PH_3$, $GeF_4$, $SiF_4$, $H_2Se$ and other boron, silicon, arsenic, phosphorus and germanium-containing dopant sources. Additionally, other plasma source reagents could be used.

In a specific application, the invention provides a method of increasing stability of an ion source used to generate $BF_3$ plasma, in which the method includes cleaning the ion source with a fluorinated xenon plasma, such as a $XeF_2$ plasma.

In another implementation, the invention relates to an ion implantation method, involving generating a plasma in an arc chamber of an ion implantation system from a dopant source gas flowed through the arc chamber to form dopant source ions for implantation. During at least part of the time during which the dopant source gas is flowed through the arc chamber, gas-phase reactive material is flowed through the arc chamber concurrently with the dopant source gas, to effect cleaning in the ion implantation system.

In general, although concurrent flow of the dopant source gas and gas-phase reactive material may be effected to achieve in situ cleaning, it typically is preferred to effect the cleaning operation in a sequential manner, e.g., when the ion source is generating a first plasma from a first dopant source, and subsequently the ion source is generating a second plasma from a second dopant source, an intervening cleaning step is employed, in which gas-phase reactive material is flowed through the ion source, with or without plasma generation.

In one embodiment, the invention provides a method of forming a doped silicon substrate, comprising implanting $Xe^+$ ions in a silicon substrate, and thereafter implanting dopant ions in the silicon substrate. In the process, the implanting of the $Xe^+$ ions serves to amorphize the crystal structure of said substrate.

In the generation of a fluorinated xenon plasma, e.g., an $XeF_2$ plasma, for cleaning, $Xe^+$ ions may do some low energy sputter cleaning of the source itself. After extraction, the $Xe^+$ ions may do some high energy sputtering of components downstream of the ion source, such as vacuum walls, ion optical components, wafer discs and wafer holders.

The present invention in a specific embodiment relates to a method and apparatus for cleaning the ion source region of an ion implantation system used in the fabrication of a microelectronic device. The ion source region may for example include an indirectly heated cathode source, a Freeman source or a Bernas source.

Specifically, the present invention in one embodiment relates to the in situ removal of residue from the vacuum chamber of the ion implanter and components contained therein by contacting the vacuum chamber and/or components with a gas-phase reactive halide composition, e.g., $XeF_2$, $XeF_4$, $XeF_6$, $NF_3$, $F_2$, $SF_6$, $C_2F_6$, $CF_4$, $IF_5$, $IF_7$, $KrF_2$, $Cl_2$, $HCl$, $ClF_3$, $ClO_2$, $N_2F_4$, $N_2F_2$, $N_3F$, $NFH_2$, $NH_2F$, $HOBr$, $Br_2$, $C_3F_8$, $C_4F_8$, $C_5F_8$, $CHF_3$, $CH_2F_2$, $CH_3F$, $COF_2$, $HF$, $C_2HF_5$, $C_2H_2F_4$, $C_2H_3F_3$, $C_2H_4F_2$, $C_2H_5F$, $C_3F_6$, and organochlorides such as $COCl_2$, $CCl_4$, $CHCl_3$, $CH_2Cl_2$, and $CH_3Cl$, for sufficient time and under sufficient conditions to at least partially remove the residue from the components, and to do so in such a manner that when the residue and the material from which the components are constructed is different, the gas-phase reactive material is selectively reactive with the residue and minimally reactive (e.g. substantially non-reactive, and preferably completely non-reactive) with the materials from which the components of the ion implanter are constructed; and when the residue and the material from which the components are constructed is the same, then the gas-phase reactive material may be reactive with both the residue and the component part.

As used herein, the term "selectively," as applied to the reactivity of the gas-phase reactive halide with a residue, is used to describe a preferential reaction between the gas-phase reactive halide and a residue. While remaining essentially non-reactive with the materials from which the components of the ion implanter are constructed, the gas-phase reactive halide may react with some with the materials from which the components of the ion implanter are constructed if those components comprise elements that are the same or similar to those of the residue itself. For example, while being selectively reactive and removing tungsten deposits from a component, the gas-phase reactive material might also react with tungsten in the component itself. The residue and the components do not have to be exactly the same material for such co-reaction to occur, but will comprise some materials in common.

In another embodiment, the ion implanter components are cleaned ex situ, in a separate dedicated chamber to which the components are removed from the ion implanter.

Considering in situ cleaning in further detail, such cleaning is primarily dependent on three factors: the reactive nature of the cleaning precursor, the volatility of the cleaning reaction by-products, and the reaction conditions employed in the chemical cleaning. The cleaning composition must remove unwanted residue while minimizing wear of the materials of construction of the implanter. The byproducts generated by the cleaning reaction must be volatile enough to facilitate their removal by the vacuum system of the ion implanter.

The cleaning of residue formed from the same material as the component(s) does result in some wear of the component itself. Specifically, use of $XeF_2$ as a cleaning agent to remove tungsten deposits from a system utilizing a tungsten arc chamber will result in removal of some tungsten from the interior of the arc chamber. However, in the interest of maximizing system efficiency, loss of some of the interior material of the arc chamber is not significant when viewed in light of the decreased system performance if the system is not cleaned and the tungsten deposits are allowed to accumulate in the system.

As used herein, "ion source region" includes the vacuum chamber, the source arc chamber, the source insulators, the extraction electrodes, the suppression electrodes, the high voltage insulators, the source bushing, the filament and the repeller electrode.

The gas-phase reactive material may for example include a fluorinated xenon compound vapor, such as $XeF_2$ vapor. $XeF_2$ is a preferred reactive halide gas, and will sublime at room temperature, but may be heated using a heater to increase the rate of sublimation. $XeF_2$ is known to be an effective silicon etchant and has been used as a silicon selective etchant in Micro Electro Mechanical System (MEMS) device processing. Specifically, $XeF_2$ reacts with silicon according to the following reaction.

$$2XeF_2(g) + Si(s) \rightarrow 2Xe(g) + SiF_4(g) \quad (3)$$

Importantly, the silicon/$XeF_2$ reaction can occur without activation, i.e., plasma or thermal heating. The reaction rate of $XeF_2$ with Si is much greater than the reaction rate of $XeF_2$ with $SiO_2$, making $XeF_2$ selective for reaction with Si.

$XeF_2$ or other fluorinated xenon compound is usefully employed in the practice of the invention as an etchant for metallic boron. Although not wishing to be bound by theory, it is thought that the boron is etched according to the following reaction.

$$3XeF_2(g) + 2B(s) \rightarrow 3Xe(g) + 2BF_3(g) \quad (4)$$

The use of $XeF_2$ as an etchant for arsenic, phosphorus and germanium has not been reported to the best of our knowledge; however, $XeF_2$ may prove to be an effective etchant for these materials as well according to the following reactions (4) and (5).

$$5XeF_2(g) + 2As(s) \rightarrow 5Xe(g) + 2AsF_5(g) \quad (5)$$

$$5XeF_2(g) + 2P(s) \rightarrow 5Xe(g) + 2PF_5(g) \quad (6)$$

$$2XeF_2(g) + Ge(s) \rightarrow 2Xe(g) + GeF_4(g) \quad (7)$$

Similar to the silicon/$XeF_2$ reaction, the reactions disclosed herein may occur with or without energetic activation.

Importantly, the method and apparatus described herein are used to at least partially remove the residue from the components of the ion implanter, and to do so in such a manner that residue is removed selectively with respect to the materials from which the components of the ion implanter are constructed, e.g., aluminum, tungsten, molybdenum, graphite, insulator materials, sealant materials, etc., when the residue material differs from those materials. As used herein, the term "at least partially remove" is defined as the removal of at least about 25%, more preferably at least about 50%, and most preferably at least about 75% of the residue to be removed.

However, when the residue and the material from which the components are constructed is the same, then the gas-phase reactive material composition may be reactive with both the residue and the component part in an amount and for a time such that at least about 25%, more preferably at least about 50%, and most preferably at least about 75% of the residue is removed. Under such conditions, removal of the interior of the component will be minimal, generally in the range of microns or tens of microns. Where the component may have a total thickness of up to about a quarter of an inch or more, such removal will not significantly affect the performance of the component. As the deposits generally do not have a uniform thickness or deposition, those deposits may be more reactive than the material of the component itself in the cleaning process. As such, the gas-phase reactive material composition may be more selective to reaction with the residue than to reaction with the component part.

Several modes of delivery of the gas-phase reactive material composition to the ion source region for in situ cleaning therein are discussed more fully hereinafter, including a stagnant mode, a continuous mode, and a direct introduction mode. Although reference may be made herein to a $XeF_2$ composition it will be understood that other fluorinated xenon compounds and other reactive halide compositions may be used, including, without limitation, $XeF_4$, $XeF_6$, $SF_6$, $C_2F_6$, $IF_5$, $IF_7$, $KrF_2$, $CF_4$, $Cl_2$, $HCl$, $ClF_3$, $ClO_2$, $N_2F_4$, $N_2F_2$, $N_3F$, $NFH_2$, $NH_2F$, $HOBr$, $Br_2$, $C_3F_8$, $C_4F_8$, $C_5F_8$, $CHF_3$, $CH_2F_2$, $CH_3F$, $COF_2$, $HF$, $C_2HF_5$, $C_2H_2F_4$, $C_2H_3F_3$, $C_2H_4F_2$, $C_2H_5F$, $C_3F_6$, and organochlorides such as $COCl_2$, $CCl_4$, $CHCl_3$, $CH_2Cl_2$, and $CH_3Cl$. It is further noted that the gas-phase reactive material, may comprise, consist essentially of or consist of the reactive halide compound(s).

$XeF_2$ affords several advantages for cleaning most ion implant residues in situ. $XeF_2$ is a sublimable white solid with a vapor pressure of 4 Torr at room temperature. For abatement of the byproduct gases resulting from use of $XeF_2$ cleaning, chemisorption-based scrubbers are preferred for abating both hydrides and fluorinated implanter species including $XeF_2$. The cleaning composition may be supplied from a source that is particularly adapted for delivery of $XeF_2$ or other cleaning reagent, such as the solid source delivery system more fully described in international patent application PCT/US 06/08530 for "SYSTEM FOR DELIVERY OF REAGENTS FROM SOLID SOURCES," based on U.S. Provisional Patent Application No. 60/662,515 and U.S. Provisional Patent Application No. 60/662,396, the disclosures of which hereby are incorporated herein by reference in their respective entireties.

In additional embodiments, additional fluorinated xenons are preferred compositions in the practice of the invention. $XeF_4$ has a molecular weight of 207.28, a melting point of 117.1° C., a boiling point (sublimation) of 115.75° C. and a density of 4.04 g/mL. An additional compound, $XeF_6$, has a molecular weight of 245.28, a melting point of 49.5° C., a boiling point of 75.6° C. and a density of 3.56 g/mL. It is noted that as the number of fluorine atoms increases, the melting point decreases and the vapor pressure is likely higher. A higher vapor pressure will aid in delivery of the cleaning agent and may allow for faster and more efficient cleaning.

In another embodiment, the invention provides a cleaning agent $KrF_2$, with a molecular weight of 121.8 and a decomposition temperature of approximately 25° C.

In another embodiment the invention provides a cleaning agent $N_2F_4$, with a critical temperature of 37° C. The vapor pressure of $N_2F_4$ is about 380 psi at 22° C. With such a high vapor pressure, $N_2F_4$ is a highly effective cleaning agent of the invention.

In one specific embodiment, the invention provides a method of cleaning at least one component of an ion implantation system where the system has an arc chamber comprising tungsten or molybdenum and the component(s) comprise deposits of the same material as the arc chamber. In such a method of cleaning, the cleaning agent may be $XeF_2$. Other cleaning agents may be utilized as set forth herein.

Stagnant Mode of Delivery of Gas-Phase Reactive Material Composition

In the stagnant mode, also referred to as the static mode, the vacuum chamber is sealed, vacuum pumps are isolated or turned off, and cleaning vapor is introduced into the chamber from a cleaning composition source until a suitable pressure is achieved. The flow of cleaning vapor is turned off, and the cleaning vapor reacts with the deposited material in the chamber at ambient (room) temperature and without plasma activation, remaining in the chamber until the cleaning vapor is consumed, an endpoint of the reaction is reached or a predetermined amount of time has passed. The gaseous byproducts of the cleaning then are pumped away. Multiple cycles of filling the chamber with cleaning vapor, reacting the vapor with deposits in the chamber, and pumping the products away from the chamber, may be required to effectively remove all of the deposited material. This process may be referred to as a "purge/vent process." During this process, the turbo pump is turned off, or, alternatively, the pump is isolated from the vacuum system with a suitable gate valve (e.g. VAT gate valve).

In one embodiment of the stagnant mode of delivery, the deposits are deposits resulting from reaction of the dopant with the material of one or more components of the system. In cleaning of such deposits, the temperature of the system or the component on which the residue is present is reduced. As the material is deposited at a higher temperature than it was formed, a lower temperature will allow for removal of the residue. For example, where the deposit is a tungsten deposit on a filament, the filament current is reduced or turned off, so that the filament temperature is reduced for cleaning. In another example, where the deposit is a tungsten deposit on a repeller electrode, the plasma arc current is reduced or turned off, so that the repeller temperature is reduced for cleaning.

In another embodiment of the stagnant mode of delivery of the gas-phase reactive material composition, an etchant container with a gas-phase reactive halide composition disposed therein is communicatively attached to the chamber of the ion implanter to be cleaned, wherein the etchant container and the chamber to be cleaned have a valve disposed therebetween. During cleaning, the valve may be manually or remotely opened whereby the gas-phase reactive material vapor is permitted to fill the chamber to be cleaned until a pre-determined pressure is attained. The etchant container may be moderately heated to increase the sublimation rate and/or the sublimation pressure.

In a more preferred embodiment, the cleaning apparatus includes a separate holding chamber of sufficient volume positioned between the etchant container and vacuum chamber. The gas-phase reactive material may be flowed first into the holding chamber and stored therein until a pre-determined pressure threshold is reached. Such holding chamber serves to allow immediate gas flow to the vacuum chamber on demand and to shorten the "waiting-period" associated with sublimation. The walls of the holding chamber may be heated to permit higher pressure storage while avoiding condensation of gas-phase reactive material on interior surfaces of the chamber. The holding chamber may further comprise flow-regulating devices, such as a mass flow controller, to achieve reproducible delivery of gas-phase reactive material into the vacuum chamber. In order to facilitate its evaporation, the gas-phase reactive material within the supply vessel may be dispersed in the pores of a thermally conductive material such as porous aluminum.

In another embodiment, the etchant container is mounted on a mobile cart so that it may be connected to any one or more of a number of vacuum chambers operating in a factory production environment. The mobile cart may optionally also incorporate valves, electronic controls, a holding chamber, vacuum pumps and a length of vacuum bellows for easy connection to different vacuum chambers. The cart may also optionally be surrounded by an enclosure which is vented to a toxic abatement system to enhance safety in the factory. Thus the mobile cart may be moved around the factory as required to enable cleaning of vacuum chambers during scheduled maintenance periods of production vacuum equipment, such as ion implanters.

In a preferred embodiment, the present invention relates to a method of cleaning at least one component of a semiconductor manufacturing tool, said method comprising:
 (a) introducing an etchant gas from an etchant container into a vacuum chamber of the semiconductor manufacturing tool;
 (b) terminating introduction of the etchant gas into the vacuum chamber upon attainment of a predetermined characteristic in the vacuum chamber; and
 (c) reacting the etchant gas with a residue in the vacuum chamber for a sufficient time to at least partially remove the residue from the interior of the vacuum chamber or at least one component contained therein;
wherein the etchant gas reacts selectively with the residue in the vacuum chamber, while being essentially non-reactive with the interior of the vacuum chamber or the components contained therein when the residue and the interior of the vacuum chamber comprise different materials. Predetermined characteristics for determining termination of introduction of the etchant gas into the vacuum chamber may be based upon characteristics such as temperature, pressure, measurement of a species, etc.

When the residue in the vacuum chamber and the interior of the vacuum chamber or the components contained therein comprise the same materials, the etchant gas may react with the residue and the interior of the vacuum chamber or the components contained therein at a similar rate. However, in a preferred embodiment when the residue in the vacuum chamber and the interior of the vacuum chamber or the components contained therein comprise the same materials, the etchant gas will react with the residue at higher rate as compared to the chamber or component therein due to the morphology of the residue, (e.g. higher surface area) of the residue.

Once the desired pressure in the vacuum chamber has been attained, the vacuum chamber is sealed and the gas-phase reactive material permitted to react for sufficient time and under sufficient conditions to at least partially remove the residue from the vacuum chamber and the components contained therein. The vacuum chamber can then be evacuated and the cleaning process repeated as needed. The evacuated gas mixture may be further directed to abatement units including, but not limited to, chemical and/or physical adsorption beds, incinerators, wet scrubbers, or a combination thereof.

The internal pressure, time, and number of repeat cleanings may be readily determined by those of ordinary skill in the art. The nature and extent of the cleaning of the residue may be empirically determined while varying the time and/or contacting conditions (such as temperature, pressure, concentration and partial pressure) of the gas-phase reactive material to identify the process conditions producing a desired residue removal result. For example, the partial pressure of an $XeF_2$ composition in the vacuum chamber may be about 0.1 Torr to about 4.0 Torr, preferably about 0.3 Torr to about 2.0 Torr, and the length of cleaning about 1 to about 4 minutes, which may be repeated about two (2) to about one hundred (100) times. Preferably, the partial pressure of the $XeF_2$ is about 2.0 Torr and the length of cleaning about 0.1 to 1.0 minute. Importantly, the pressure in the vacuum chamber during cleaning should be carefully monitored as the pressure will gradually increase as the cleaning reaction proceeds and should plateau (pressure change goes to zero) when the reaction has run its course.

A residual gas analyzer may be used to measure the concentration of gas-phase reactive material and other reaction byproducts, which may also be useful for monitoring the progress of the cleaning process. A residual gas analyzer (RGA), as shown schematically in FIG. 3, may be attached to the vacuum chamber and used to monitor the by-products of the residue removal reactions. The RGA may be a 1 to 100 amu, 1 to 200 amu or 1 to 300 amu analyzer, most preferably a 1 to 300 amu analyzer.

Figure 9:
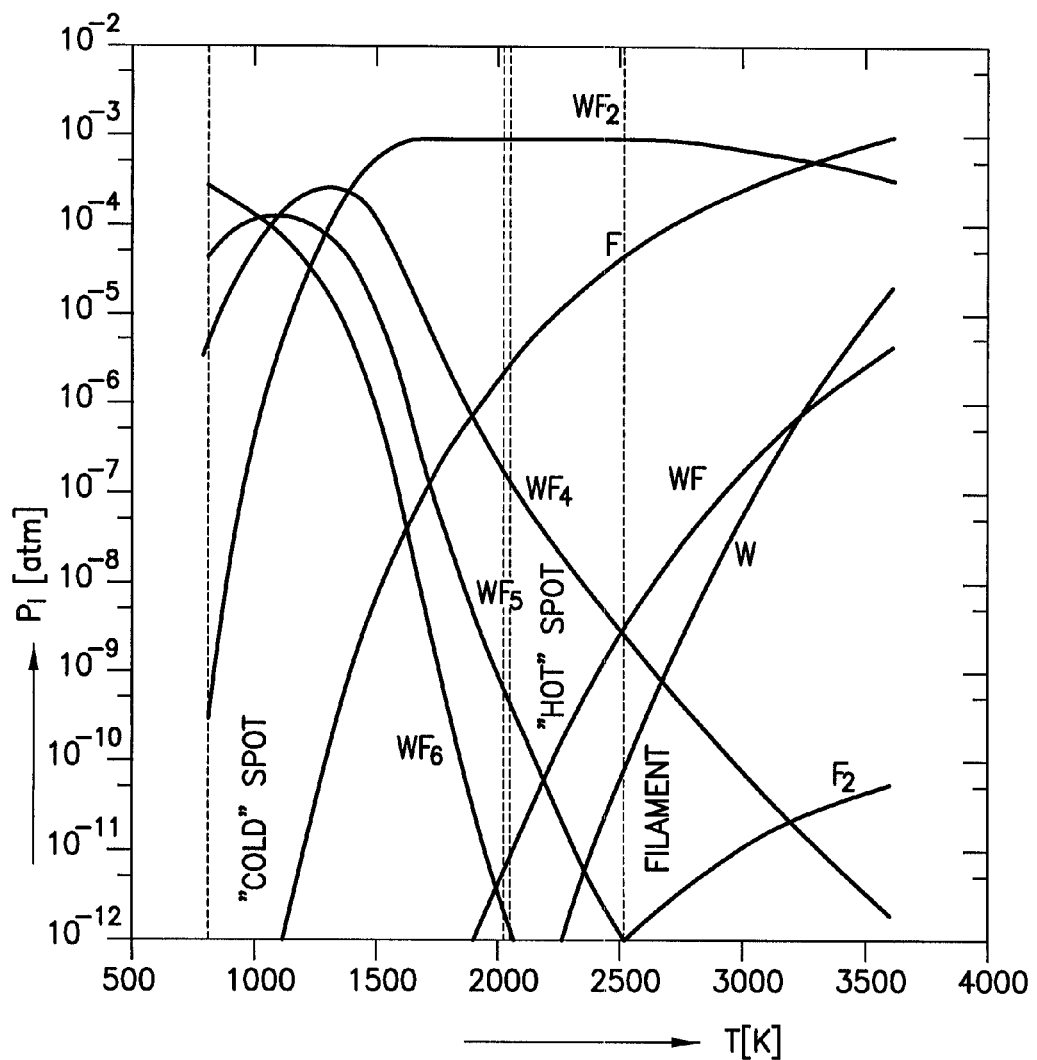
FIG. 9 is a graph of the gas phases of W and $F_2$ with respect to temperature.

Preferably, the gas-phase reactive material reacts without energetic activation, although activation is contemplated herein. Thus, effective cleaning can be performed at room temperature, although cleaning is contemplated at temperature in a range of about 0° C. to about 1000° C. depending on the circumstances.

Where the deposit is of the same material as the material from which one or more components of the system are constructed, then the temperature of the cleaning should be lower than the temperature at which the deposition occurred. The gas phases of W and $F_2$ with respect to temperature correspond to those in the graph set forth as FIG. 9 (Graph reproduced from "Thermodynamics of heterogeneous gas equilibriums. II. Gas phase composition and chemical transport reactions in the tungsten-halogen (fluorine, chlorine, bromine) systems." G. M. Neumann, G. Gottschalk. Zeitschrift fuer Naturforschung, Teil A: Astrophysik, Physik and Physikalische Chemie 26 (5), 870 (1971)). It can be seen that as the temperature increases, the proportions of W and $F_2$ change. Specifically, the amounts of tungsten fluorides with a high W/F ratio sharply decrease with temperature starting at about 1000K and at the same time partial pressure of free fluorine atoms (F) and molecular fluorine ($F_2$) increase with temperature. Therefore, if the system has limited amount of fluorine at both low and high temperatures the concentration of tungsten in the gas phase will be lower than at some intermediate temperatures. In the case of low temperature, tungsten depletion of the gas phase is caused by the fact that fluorine is consumed for formation of tungsten fluoride richer in fluorine (e.g. $WF_6$, $WF_5$ and $WF_4$). In the case of high temperature, large amounts of fluorine exist as free F or $F_2$ species. This phenomenon is responsible for tungsten transport from an intermediate temperature region ("hot" spot) to both low and high temperature regions ("cold" spot and filament, respectively). Due to the presence of plasma in the arc chamber, the transport of tungsten is changed in a way that only deposition on the filament is pronounced, whereas tungsten redeposition on the low temperature region is interrupted by ion bombardment from plasma. Accordingly, cleaning of the filament must be conducted in a low temperature range to prevent tungsten redeposition. Preferably the cleaning is performed in a range of from about 0° C. to about 1000° C. More preferably the cleaning is performed in a range of from about room temperature to about 800K.

Accordingly, when the residue to be removed differs from the material of the components of the system, the process parameters are chosen to ensure that the gas-phase reactive material is essentially non-reactive with the ion source region components material of construction. As used herein, "essentially non-reactive" corresponds to less than about 5% of the total gas-phase reactive material reacts with the components of the ion source region, preferably less than about 2%, most preferably less than about 1%.

FIG. 1 is a schematic representation of an ion implanter system 10 incorporating static mode cleaning according to one embodiment of the invention.

The ion source region of the implanter system 10 shown in FIG. 1 includes vacuum chamber 100, an arc chamber 16, the acceleration electrode 14, the deceleration electrode 12, the cathode 18, the anticathode 20 and the gate valve 110. The cleaning composition source container (also referred to herein as the "etchant container") 80 holding the cleaning composition may be communicatively connected to the vacuum chamber 100 by the dedicated vapor feed line 90. To introduce the gas-phase reactive material into the arc chamber 16, valve 84 is manually or automatically opened to permit the gas-phase reactive material to flow from the container 80 to the vacuum chamber 100. Sublimation of the gas-phase reactive material source may be assisted by heating the etchant container 80 using a heater 86 including, but not limited to, heater wires 88, or an oven. The etchant heater may also be heated by resistant heat methods, convective heat methods, conductive heat from air or from a warm source, from a heat lamp or other radiative mechanism or by any other effective heating method. The entire etchant container housing 82 may be water cooled.

Alternatively, gas-phase reactive material from a cleaning composition source container such as 40, may be introduced into the arc chamber 16 with carrier gas, e.g., argon, from carrier gas source 44, flowed into cleaning gas feed line 47. In such operation, valves 42 and 46 in line 47 are both open. The gas-phase reactive material in container 40 can be heated or otherwise volatilized, for flow of the cleaning agent in a gaseous state to the arc chamber and vacuum chamber.

As a further alternative, the carrier gas source 44 may be isolated by closure of the valve 46, so that gas-phase reactive material flows in feed line 47 to the arc chamber 16 in vacuum chamber 100. Valve 42 is open for such operation. Additional cleaning gas may be introduced in gas inlet line 22 for mixing with gas-phase reactive material ($XeF_2$ in FIG. 1) in line 47, to form a multicomponent cleaning gas. Alternatively, the gas inlet line may be closed, e.g., by closure of a valve (not shown) therein during the cleaning process.

During normal ion implantation operation, the dopant gas is flowed into the arc chamber 16 in the gas inlet line 22.

Thus, the gas-phase reactive material may be introduced to the arc chamber, to the vacuum chamber, in neat form, or in combination with another gas species, e.g., a carrier gas or a second or further cleaning gas.

Although not illustrated in FIG. 1, a holding chamber may be situated between the etchant container and the vacuum or arc chamber.

Following at least partial removal of the residue from the interior of the chamber to be cleaned, valve 92 is opened and the gases are evacuated using pump 96 via outlet line 94.

The FIG. 1 system 10 thereby is adapted to operate in the stagnant cleaning mode, in which the vacuum chamber is sealed, the vacuum pump 96 is isolated or turned off, and the gas-phase reactive material is introduced into the chamber until a predetermined pressure is reached. The gas-phase reactive material thereafter reacts with the deposits and effects chemical reactive cleaning of the vacuum chamber 100 and the arc chamber 16 and other components in the vacuum chamber. When the requisite degree of cleaning reaction has been achieved, the reaction cleaning product gases (unreacted cleaning agent, carrier gases, reaction by-product gases, gases evolved from system components in situ in the vacuum chamber, etc.) are discharged from the vacuum chamber.

The stagnant cleaning mode can be carried out with the system 10 in a cold condition, i.e., with the vacuum chamber and its internal components being unheated, and at ambient temperature (e.g., temperature in a range of 20-40° C.), so that the cleaning composition is introduced for cleaning of the vacuum chamber and internal components thereof at such ambient temperature. Alternatively, the stagnant cleaning mode of operation can be carried out with the ion source (arc chamber) hot, by energizing the filament without applying an arc voltage between the filament and the arc chamber body, whereby the filament heats the gas-phase reactive material without striking a plasma. However, as set forth above, when the residue to be removed is the same as the material of one or more components of the system, the cleaning is carried out at a temperature lower than that at which the residue was formed.

Once the cleaning composition is introduced into the vacuum chamber, and the chamber is sealed, the cleaning composition is retained in the chamber for an appropriate time providing the desired extent of cleaning action. In addition to vacuum pump extraction of the cleaning gas effluent from the vacuum chamber after the cleaning operation has been completed, the cleaning gas effluent may also be removed from the cleaned chamber by displacement, e.g., by pumping an inert or other gas through the chamber until the effluent has been removed.

A cleaning mode in which the chamber 100 is not entirely sealed, but valve 92 is a valve with a controllable aperture which is controlled in response to the pressure in the chamber 100, attains a constant pressure for cleaning, but without the need for pump/purge cycles.

Therefore in one embodiment the invention provides a continuous flow of cleaning agent into the implant chamber or other components to be cleaned. The pressure within the chamber can then be regulated by a pressure-control valve on the outlet of the chamber. Such regulation of pressure may be in a pulsed or sinusoidal fashion. By regulating the output from the chamber, a relatively constant partial pressure of cleaning agent can be maintained in the chamber. As such, a higher reaction rate may be maintained, and the need for repeated pump/purge cycles is avoided. The embodiment provides the additional advantage of a reduced thickness of the boundary material layer, as the cleaning gas is constantly flowing, providing a higher mass transfer rate of cleaning agent to the substrate surface. The valves utilized in this embodiment may be of any type known in the art, suitable for regulating the output of the chamber.

In another embodiment, the inlet valve to the chamber, allowing flow of the cleaning gas, may be adjustable, such that the flow of the cleaning gas into the chamber may also be regulated.

Such continuous cleaning may offer advantages such as: decreased reaction time, decreased byproduct species buildup and the ability to clean the system without having to turn off the turbo pump and/or any purge gas, e.g. $N_2$. This is desirable in the art, as cycling turbo pumps on and off may significantly reduce their lifetime, and actually turning the pump off to perform a cleaning operation increases control complexity of the operation and increases overall time requirements of the implantation and cleaning process.

Continuous Mode of Delivery of Gas-Phase Reactive Material

In the continuous mode, also referred to as the dynamic mode, the gas-phase reactive material is flowed through the vacuum chamber (preferably through the arc chamber), with a high rate of vacuum pumping which maintains a low pressure (less than $10^{-2}$ torr, and preferably less than $10^{-4}$ torr) within the vacuum chamber, while the pressure within the arc chamber is higher (greater than $10^{-2}$ torr, and preferably less than 0.1 torr) so that most of the chemical cleaning occurs within or near the arc chamber.

The continuous mode can be carried out in various ways. In a first technique of "continuous plasma operation," the gas-phase reactive material is flowed through the arc chamber while the arc is on, and plasma is being generated. In a second technique of "source cold operation," the gas-phase reactive material is flowed through the arc chamber while the chamber is cold, and the arc is off, so that no plasma is being generated. In a third technique of "source hot operation," the gas-phase reactive material is flowed through the arc chamber with the filament energized but no arc voltage applied, so that the filament heats the arc chamber without striking a plasma.

Thus, the cleaning vapor may be introduced to the ion implanter while the ion source is operating, so that cleaning is effected by the resultant plasma. The cleaning vapor can be introduced simultaneously with the dopant species so that the system undergoes cleaning during normal ion implantation operation. However, when the deposits comprise tungsten or molybdenum, the cleaning is not performed when the system is operating to perform normal ion implantation.

Alternatively, a separate cleaning plasma can be used to clean the ion source during changes of the dopant species.

The ion source can also be chemically cleaned while it is not operating. In such case, the cleaning vapor must be capable of cleaning a cold ion source without plasma. If the vapor cannot clean without plasma activation, then a separate source of plasma radicals must be supplied external to the ion implanter.

When cleaning vapor is flowing from its point of entry through the arc chamber and out through pump exhaust manifolds of the ion implanter, the highest levels of removal of the deposits in the chamber take place primarily along the flow path of the vapor.

In a specific embodiment, an etchant container with the cleaning agent composition disposed therein is directly or indirectly communicatively attached to the vacuum chamber or to the arc chamber, with at least one valve disposed in the cleaning gas flow path between the etchant container and the chamber(s) to be cleaned. An inert carrier gas may be arranged to flow continuously over the gas-phase reactive material in the etchant container to deliver a steady stream of gas-phase reactive material to the chamber to be cleaned. The flow rate of the carrier gas, temperature of the etchant container, and cleaning time are experimental parameters readily determined by those skilled in the art. Similar to the stagnant mode, a holding chamber may be situated between the etchant container and the chamber to be cleaned.

Figure 2:
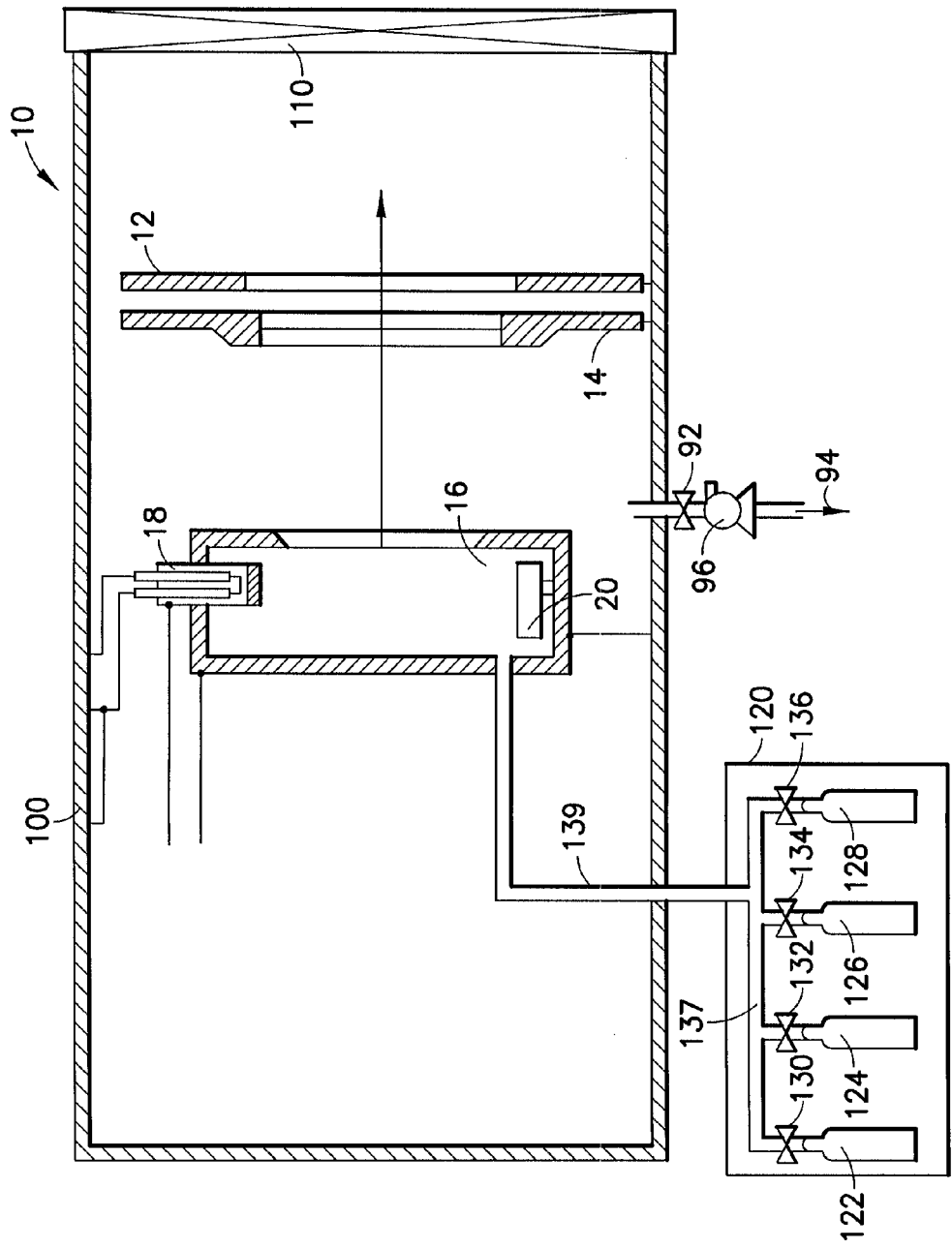
FIG. 2 is a schematic representation of an ion implanter system incorporating dynamic mode cleaning according to another embodiment of the invention.

An example of the continuous cleaning mode, wherein the etchant container holding the cleaning composition is communicatively connected to the arc chamber, is shown in FIG. 2, wherein corresponding components of the system 10 are numbered correspondingly to the same or similar components of the system of FIG. 1 described hereinabove.

In the FIG. 2 system 10, the etchant container 122 holding the cleaning composition is communicatively connected to the manifold 137 by a gas discharge line containing valve 130 therein, and the manifold 137 in turn is joined to gas inlet line 139 coupled with the arc chamber 16 for flowing gas into such chamber.

In this arrangement, the etchant container 122 is contained in a source gas box 120. The source gas box 120 also holds gas containers 124, 126, and 128, which may contain for example dopant source gas, inert carrier gas, additional cleaning gas, etc., in one or more of such containers 124, 126 and 128. The gas container 124 is joined to the manifold 137 by a gas discharge line containing valve 132 therein, the gas container 126 is joined to the manifold 137 by a gas discharge line containing valve 134 therein, and the gas container 128 is joined to the manifold 137 by a gas discharge line containing valve 136 therein.

The various valves 130, 132, 134 and 136 in the gas discharge lines joined to manifold 137 can be of any suitable type, including pneumatic valves, solenoid valves, etc., as may be desirable and appropriate in the specific implementation of the FIG. 2 system. Such valves can be coupled by suitable valve actuators to a central processing unit (CPU), e.g., a microprocessor, programmable logic controller, general purpose programmable computer, or other CPU apparatus that programmably modulates the valves 130, 132, 134 and 136, according to a cycle time program or other sequence that effects the continuous mode cleaning, either during plasma generation (during dopant source gas flow to the arc chamber, and/or during dopant source gas non-flow conditions) or during non-plasma conditions (involving source hot and/or source cold conditions).

During the flow of gas through the vacuum chamber 100, withdrawal of gas from the vacuum chamber is effected by outlet valve 92, pump 96 and outlet line 94. As an example, container 122 may hold a cleaning gas, container 124 may hold inert carrier gas, container 126 may hold a second cleaning gas, and container 128 may hold a dopant source gas. In such arrangement, the dopant gas in container 128 may be flowed through the arc chamber to generate the dopant species under plasma generation conditions. Simultaneously, or subsequently, the cleaning gas, carrier gas and second cleaning gas may be flowed through the arc chamber to effect in situ cleaning of the arc chamber. Pump 96 is actuated during such flows, with valve 92 being open, to effect pumping of gas out of the vacuum chamber 100.

Inert gases contemplated herein include, but are not limited to, argon, nitrogen, xenon, and helium. A further alternative includes sublimation assistance by heating the etchant container 122 using a heater, as described previously with regards to the stagnant mode in the embodiment of FIG. 1. It will be recognized that the FIG. 2 embodiment may in a variant modification be provided with a second source of cleaning gas coupled in flow communication with the vacuum chamber 100, to provide additional ingress of cleaning gas to the vacuum chamber, e.g., for carrying out both stagnant mode and continuous mode cleaning, such as where continuous mode cleaning is carried out as a main mode of cleaning, and periodically, the vacuum chamber is subjected to stagnant mode cleaning.

The outlet line 94 may be coupled with an end point monitoring unit that is adapted to sense the concentration of one or more components of the exhaust gas from the vacuum chamber and to generate a corresponding output indicative of the end point of the cleaning process. Such endpoint monitor can be of any suitable type, as discussed previously.

Pulsed Pressure Cleaning

In the pulsed pressure mode of delivery, cleaning of the ion implantation system is effected by variation of the pressure within the reaction chamber of the system. In one embodiment, the system contains a control valve at the exit of the reaction chamber. Accordingly, such pulsed pressure cleaning may be carried out by providing a constant flow of cleaning composition to the reaction chamber and altering the position of the control valve to achieve shifting pressure within the reaction chamber, as desired. Pulsed pressure cleaning may also be carried out by providing a control valve in a predetermined fixed position, and providing a varied flow of cleaning composition to the reaction chamber, such that the pressure within the reaction chamber is varied.

Direct Introduction Mode of Delivery of Gas-Phase Reactive Material

In the direct introduction mode, an etchant container with pre-measured amounts of cleaning agent composition, e.g., $XeF_2$ in the form of pellets, is introduced into the sealed vacuum chamber. The $XeF_2$ completely sublimates in the vacuum chamber and the $XeF_2$ is permitted to react for sufficient time and under sufficient conditions to at least partially remove the residue from the ion source region components. The amount of etchant and the time required for cleaning are readily determined by those skilled in the art. Methods for mechanical dispensing, i.e., utilizing etchant containers, are readily engineered by those skilled in the art. Following at least partial removal of the residue from the interior of the chamber to be cleaned, the vacuum chamber can be exhausted of the cleaning effluent gases, by actuation of a pump and opening of a flow control valve in a gas exhaust line, in a manner similar to that described in connection with the use of a pump 96, outlet valve 94 and outlet line 94, in the embodiment of FIG. 1 hereof. Direct introduction cleaning may be repeated as necessary.

In another embodiment of the invention, the gas-phase reactive material may, for example, comprise a nitrogen trifluoride ($NF_3$) vapor. $NF_3$ is used in the semiconductor industry as a fluorine source for plasma etching, e.g., in situ chamber cleaning of CVD reactors. Additional applications include etching of polysilicon, silicon nitride, tungsten silicide and tungsten films. Specifically, $NF_3$ dissociates into reactive halide species in the plasma, such as fluorine radicals and/or fluoride ions, said reactive halide species subsequently reacting with the residue to be removed. For example, if the residue includes boron, cleaning may occur according to the following reactions (8) or (9).

$$3F_2(g) + 2B(s) \rightarrow 2BF_3(g) \tag{8}$$

$$3F(g) + B(s) \rightarrow BF_3(g) \tag{9}$$

A variety of techniques can be employed to deliver the $NF_3$ compound to the ion source region for in situ cleaning therein, including direct dissociative plasma techniques, as described more fully below, with reference to FIG. 3.

Direct Dissociative Mode of Delivery of Gas-Phase Reactive Material

Figure 3:
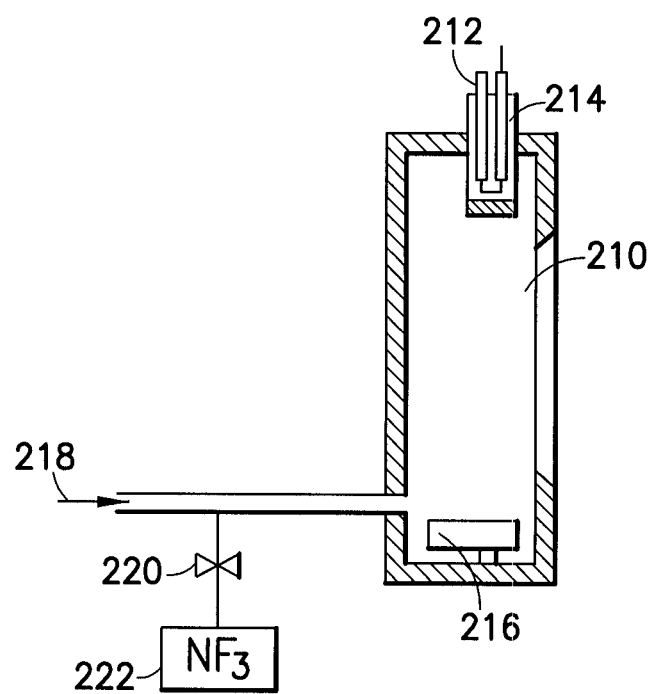
FIG. 3 is a schematic representation of an ion implanter system incorporating direct dissociative plasma cleaning according to still another embodiment of the invention.

In the direct dissociative plasma configuration, as illustratively shown in the schematic arrangement of FIG. 3, an $NF_3$ source 222 is communicatively connected to the arc chamber 210, with a valve 220 situated therebetween. The direct dissociative plasma delivery process involves subjecting the cleaning composition to plasma conditions sufficient to effect dissociation of the cleaning composition so that ionic cleaning species are generated.

In the FIG. 3 system, the $NF_3$ source is communicatively connected with the reactive gas inlet tube 218, by which reactive dopant, e.g., $BF_3$, is introduced to the arc chamber 210. This flow circuitry arrangement enables introduction of $NF_3$ simultaneously with other ion source dopant materials. However, other means of introducing $NF_3$ into the arc chamber are contemplated in alternative embodiments, for example introduction of $NF_3$ via a dedicated $NF_3$ inlet line.

During cleaning, $NF_3$ enters the arc chamber 210 and the fluoride ions are generated using the existing plasma equipment (e.g., the filament 212, cathode 214 and the anticathode 216) or using some additional electronic componentry arranged within the arc chamber 210. Diluent gases may be added to the arc chamber by gas inlet tube 218 or other diluent introduction flow circuitry, to dilute the highly reactive fluoride ions.

For such purpose, parameters such as $NF_3$ flow rate into the arc chamber, amount of diluent gas, chamber pressure and time required for cleaning are readily determined by those skilled in the art. Multiple pressures and flow rates are also contemplated, wherein the different pressures and flow rates are used sequentially to effect different plasma shapes and consequently different concentration profiles. Different profiles may be useful for cleaning different areas of the arc chamber, i.e., outer corners, etc. Following at least partial removal of the residue from the interior of the chamber, the gases are evacuated via an outlet line and optionally abated.

Additional cleaning gases contemplated for introduction using the direct dissociative plasma introduction mode, in addition to $NF_3$, include $XeF_2$, $XeF_4$, $XeF_6$, $IF_5$, $IF_7$, $KrF_2$, $SF_6$, $C_2F_6$, $CF_4$, $Cl_2$, $HCl$, $ClF_3$, $ClO_2$, $N_2F_4$, $N_2F_2$, $N_3F$, $NFH_2$, $NH_2F$, $HOBr$, $Br_2$, $C_3F_8$, $C_4F_8$, $C_5F_8$, $CHF_3$, $CH_2F_2$, $CH_3F$, $COF_2$, $HF$, $C_2HF_5$, $C_2H_2F_4$, $C_2H_3F_3$, $C_2H_4F_2$, $C_2H_5F$, $C_3F_6$, and organochlorides such as $COCl_2$, $CCl_4$, $CHCl_3$, $CH_2Cl_2$, and $CH_3Cl$.

When cleaning gases are introduced into the source arc chamber using the direct dissociative plasma introduction mode, ions may be extracted from the source plasma and employed for useful purposes other than cleaning the arc chamber. For example, $Xe^+$ ions extracted from a $XeF_2$ plasma or other fluorinated xenon compound plasma may be implanted into silicon wafers, where their high mass will make them particularly effective for amorphizing the silicon crystal lattice in the implanted region, which has certain advantages for some implant processes.

Alternatively, or additionally, $Xe^+$ ions extracted from a fluorinated xenon compound plasma, e.g., a $XeF_2$ plasma, may be used to sputter clean internal surfaces such as walls, apertures, implant holders and discs. Sputter cleaning with $Xe^+$ may be used when changing implanter species from a first dopant species to a second dopant species. Because of their high mass, the $Xe^+$ ions will be particularly effective at preventing cross contamination of implants with the second species by dopant atoms of the first species which have been implanted into the walls, apertures, implant holders and discs during the first implant.

In another embodiment of the invention, the reactive halide gas is fluorine, for example as delivered from a VAC® source container, commercially available from ATMI, Inc. (Danbury, Conn., USA). Fluorine is an extremely corrosive gas and can be used with or without thermal or electrical activation. Without activation, the fluorine gas can be admitted directly to the ion source region, wherein the gas is permitted to spontaneously react for sufficient time and under sufficient conditions to at least partially remove the residue. If additional activation is required, components may be heated or left at an elevated temperature and the gas permitted to react for sufficient time to at least partially remove the residue. In the alternative, a plasma may be generated within the arc chamber (as described previously) to further induce fluorine activation.

The invention in another embodiment relates to a method of cleaning an ion source between successive ion generation processes involving the same dopant source gas, or alternatively different dopant gases, in the successive processes. Such method comprises flowing $XeF_2$ or other fluorinated xenon compound(s) or other reactive halide compound(s) through the ion source between such processes with or without a plasma.

The embodiments described herein may be implemented directly with newly manufactured ion implantation tools or in the alternative, implanters already in use may be easily retrofitted with the cleaning systems described herein.

In a further embodiment, the etchant gas (cleaning composition) may be blended with the implanting species, e.g., $BF_3$, so that etching and implanting may occur simultaneously, which is cost-effective in terms of minimization of down time and elimination of additional expensive delivery systems. However, when the deposit comprises tungsten or molybdenum, the etching and implanting are not performed simultaneously.

The advantages of the present invention in its various embodiments include, but are not limited to, (i) selective cleaning of unwanted residue in the ion source region of an ion implantation system, (ii) the ability to clean the residue without using plasma-induced radicals, thereby minimizing damage to the components of the ion source region, and (iii) effective cleaning temperatures, including room temperature. Residue removal from the ion source region using cleaning techniques of the present invention reduces source glitching and extraction arcing, thereby contributing to more stable operation of the ion implanter. Further, the ion source lifetime and MTBF are increased, with a concomitant decrease in preventative maintenance costs and time.

It will be recognized that the frequency and/or or continuity of cleaning of ion implantation systems within the broad scope of practice of the present invention may vary widely, and the specific schedule of cleaning that is required or desirable for a particular ion implantation system can be readily determined by those of ordinary skill in the art, based on the disclosure herein.

By way of example, in some specific embodiments according to the invention, static in situ cleaning of the ion source region can be performed about 1 to 2 times per week; although the number of cleanings may be more or less often depending on how often the ion implanter is used. Typically, the length of the entire cleaning operation is about 1 hour, although the cleaning time may be more or less in specific applications. Dynamic in situ cleaning of the ion source region may be performed about 1 to 2 times per day; although the number of cleanings may be more or less often depending on how often the ion implanter is used. Typically, the length of the entire cleaning operation is about 10 minutes, although the cleaning time may be more or less in specific applications.

In another embodiment of the invention, off-line (ex situ) cleaning of the components of the ion source region using a vapor phase is employed. In this embodiment, components from any part of the ion implanter that are delicate (e.g., graphite-containing components) may be cleaned off-line, thereby eliminating exposure to conventional off-line cleaners, such as harsh abrasives or liquids. Off-line cleaning using a vapor phase material is an advance in the art because abrasives can damage the delicate components and liquids that enter the pores of the delicate components during cleaning must be pumped out of the pores during pump-down of the ion source region.

In the ex situ cleaning process, the ion source or any other power supplies are turned off, relevant isolation valves are closed, and the ion source or other vacuum chamber is vented to atmospheric pressure. Preferably, the ion source region is allowed to cool to room temperature before disengagement from the ion source region of the components that are to be cleaned.

The vacuum system components to be cleaned then are removed from the implanter and positioned in a separate, off-line vacuum chamber equipped with a simple pumping system and valves. Etchant gas is introduced into the off-line vacuum chamber, for sufficient time and under sufficient conditions to at least partially remove the residue from the components. Following each cleaning phase, the toxic by-products are pumped away to abatement units, to properly dispose of the toxic vapors. Cleaning may be effected by successive pump/purge cycles or by continuous flow cleaning processes as set forth above, in an ex situ environment. In this embodiment, the components of the ion implantation system are contained within a cleaning vessel, and the flow of cleaning gas is regulated by an output and/or input valve. As such, the partial pressure of the cleaning agent and any byproducts may be regulated and the reaction rate may be regulated and increased or decreased, as desired. Preferably, the off-line vacuum chamber is a stand-alone unit that is able to service numerous ion implanters, e.g., upwards of 10-12 ion implanters, in the fab.

Figure 4:
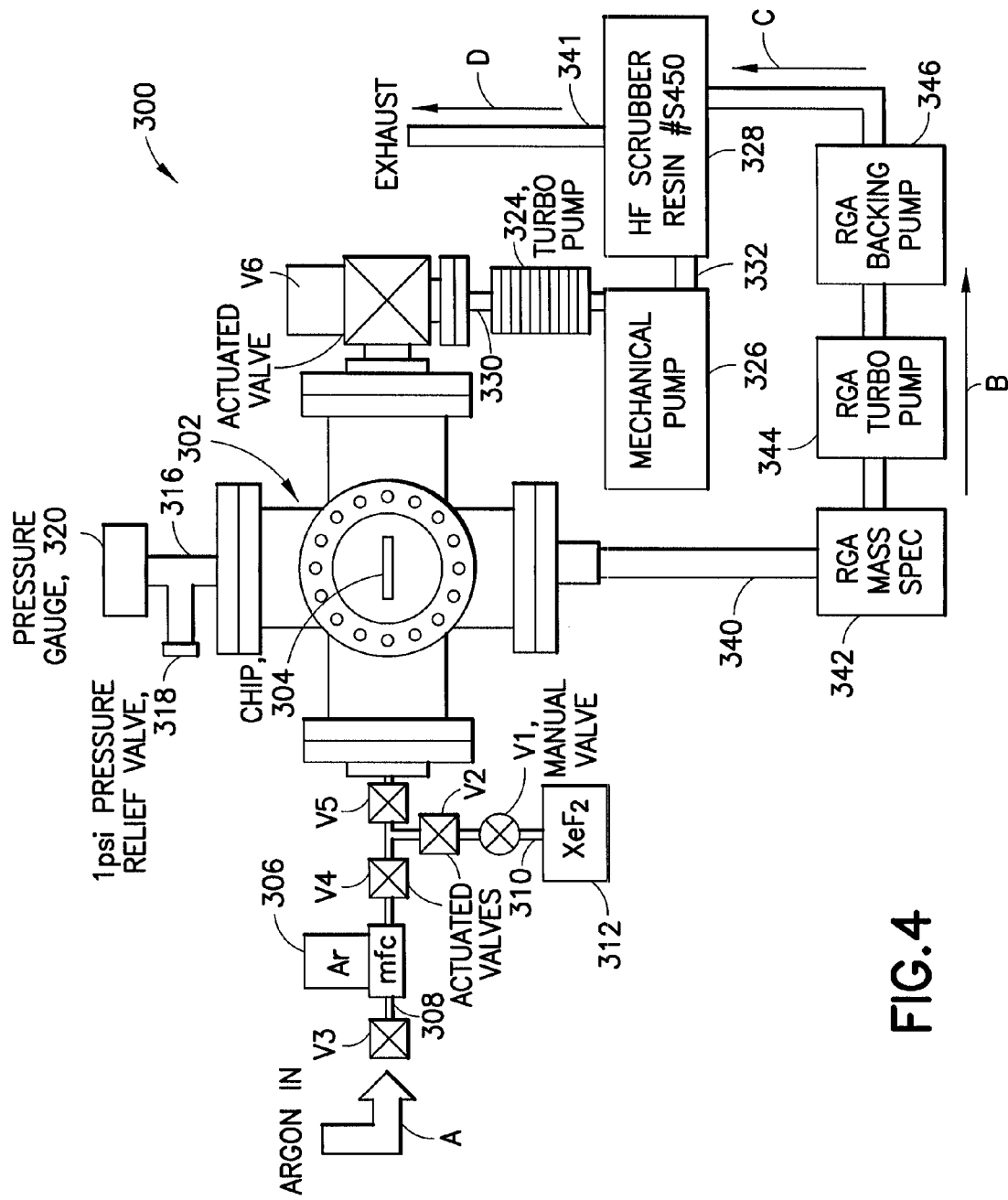
FIG. 4 is a schematic representation of a process system adapted for cleaning with $XeF_2$.

FIG. 4 is a schematic representation of a process system 300 adapted for cleaning with $XeF_2$, representing an arrangement that may be employed to assess the efficacy and characteristics of the cleaning operation, and to optimize same for a specific application.

As illustrated, this system 300 includes a source 312 of $XeF_2$ coupled to a process chamber 302 containing sample chip 304. The process chamber 302 as shown has four ports. A first one of the ports is coupled with gas feed line 308 coupled with a source of argon carrier gas schematically represented in FIG. 4 by arrow A. The feed line 308 contains flow control valves V3, V4 and V5, as well as mass flow controller 306. Joined to gas feed line 308 is a branch feed line 310 coupled in turn to cleaning gas source 312, containing $XeF_2$ in this embodiment. The branch feed line 310 contains flow control valves V1 and V2. Among the various valves, valves V2 and V4 may be actuated valves, i.e., valves equipped with valve actuators for automatic operation, and valve V1 may be a manual valve, it being recognized that the various valves can be configured and operated, manually, automatically, or in other manner, as necessary or desirable in a given implementation of the system.

The second port of the process chamber 302 is coupled with tubing 316 with two legs, a first leg coupled with a pressure relief valve 318 and a second leg coupled with a pressure gauge 320.

The third port of the process chamber 302 is coupled with an actuated valve V6 joined in turn by conduit 330 to the turbo pump 324. The turbo pump 324 is interconnected with mechanical pump 326. Mechanical pump 326 discharges gas to the discharge line 332 joined to a scrubber 328 comprising a housing containing a chemisorbent material.

The scrubber 328 is arranged with an effluent line 341 for flow therethrough of scrubbed gas in the direction indicated by arrow D.

The fourth port of the process chamber 302 is joined to effluent discharge line 340 coupled to scrubber 328. The effluent discharge line 340 has disposed therein a residual gas analyzer mass spectrometer 342, a residual gas analyzer turbo pump 344 and a residual gas analyzer backing pump 346. Effluent discharged from the fourth port of the process chamber into the effluent discharge line 340 flows therein in the direction indicated by respective arrows B and C to the scrubber 328.

As shown in FIG. 4, in operation, argon gas from source A may be flowed into feed line 308 through open flow control valves V3, V4 and V5, as well as mass flow controller 306. $XeF_2$ from cleaning gas source 312 flows through open valves V1 and V2 into branch feed line 310 and gas feed line 308, entering the process chamber 302. The pressure in the process chamber 302 maintained by the pressure relief valve 318 and monitored by the pressure gauge 320, to achieve a predetermined pressure in the process chamber 302.

Cleaning effluent gases are flowed from the process chamber 302 through conduit 330 to the turbo pump 324 and mechanical pump 326 to the scrubber 328, and are finally discharged to the effluent line 341 to the atmosphere or to other disposition.

Effluent is concurrently withdrawn from the process chamber 302 and flowed in effluent discharge line 340 through residual gas analyzer mass spectrometer 342, residual gas analyzer turbo pump 344 and residual gas analyzer backing pump 346, to effect analysis of the effluent. The analyzed effluent then flows in the effluent discharge line 340 to the scrubber 328, prior to being discharged from the system in effluent line 341.

CVD Systems

The invention contemplates in one embodiment a method of cleaning one or more components of a CVD system for at least partial removal of deposition-related deposits from said one or more components. Such method includes contacting such one or more components with a cleaning composition comprising a gas-phase reactive material, under conditions enabling reaction of the gas-phase reactive material with the deposits to effect said at least partial removal of the deposits.

"Deposition-related deposits," as used herein, refers to any deposit of material that may interfere with normal operation of the CVD system. The deposition-related deposits with which the gas-phase reactive material is reactive can be of any suitable type, including deposition-related deposits such as form and accumulate in a CVD reactor or other CVD process equipment. The deposited material may include, comprise, consist essentially of or consist of silicon, boron, phosphorous, germanium, arsenic, tungsten, molybdenum, selenium, antimony, indium tantalum and carbon.

The gas-phase reactive material used in such method in one embodiment is a gaseous halide, which may comprise any suitable halide, e.g., a halide selected from the group consisting of $XeF_2$, $XeF_4$, $XeF_6$, $NF_3$, $IF_5$, $IF_7$, $SF_6$, $C_2F_6$, $F_2$, $CF_4$, $KrF_2$, $Cl_2$, $HCl$, $ClF_3$, $ClO_2$, $N_2F_4$, $N_2F_2$, $N_3F$, $NFH_2$, $NH_2F$, $HOBr$, $Br_2$, $C_3F_8$, $C_4F_8$, $C_5F_8$, $CHF_3$, $CH_2F_2$, $CH_3F$, $COF_2$, $HF$, $C_2HF_5$, $C_2H_2F_4$, $C_2H_3F_3$, $C_2H_4F_2$, $C_2H_5F$, $C_3F_6$, and organochlorides such as $COCl_2$, $CCl_4$, $CHCl_3$, $CH_2Cl_2$, and $CH_3Cl$. In one embodiment the gas-phase reactive material comprises a halide selected from the group consisting of: $NF_3$, $CF_4$, $KrF_2$, $Cl_2$, $HCl$, $ClF_3$, $ClO_2$, $N_2F_4$, $N_2F_2$, $N_3F$, $NFH_2$, $NH_2F$, $HOBr$, $Br_2$, $C_3F_8$, $C_4F_8$, $C_5F_8$, $CHF_3$, $CH_2F_2$, $CH_3F$, $COF_2$, $HF$, $C_2HF_5$, $C_2H_2F_4$, $C_2H_3F_3$, $C_2H_4F_2$, $C_2H_5F$, $C_3F_6$, and organochlorides such as $COCl_2$, $CCl_4$, $CHCl_3$, $CH_2Cl_2$, $CH_3Cl$, $HOBr$ and $Br_2$.

The conditions enabling reaction of the gas-phase reactive material and the deposits may include any suitable conditions of temperature, pressure, flow rate, composition, etc. under which the gas-phase reactive material chemically interacts with the material sought to be removed from a substrate so as to remove such material. Examples of various conditions that maybe employed include those discussed above with respect to cleaning of ion implantation systems.

Any component of the CVD system which is subject to residue or particulate accumulation may be cleaned by the methods of the invention. In general a CVD system may comprise elements such as a precursor-containing source of the vapor to be deposited, plumbing and valves leading from the source to a reactor, the reactor, and exhaust means leading away from the reactor. The reactor itself primarily contains a disperser for dispersing the precursor, a susceptor, and a substrate. The reactor, as used herein, may also be referred to interchangeably as a "reaction chamber." The reactor may also contain a heating system and temperature sensors. The exhaust means may comprise valves and plumbing leading away from the reactor, and/or a trap designed to draw in vapors and remove them from the reactor before they back up into the reaction chamber.

Generally, some precursor will decompose during the CVD process and deposit on components of the CVD system. Alternatively, the precursor could react with the material of the one or more components of the CVD system and deposit such material elsewhere in the system. Such deposition is most commonly seen on the disperser (also referred to herein as a "showerhead"), the susceptor, the reactor downstream of the substrate, and the valve surfaces leading to the exhaust means. Some precursors decompose more than others, leaving more deposits and residue than the average precursor. Such precursors may also leave deposits and residue on the source, the plumbing and valves leading to the reactor, and any mixing volume above the showerhead or inside the disperser.

The precursor source provides the precursor to the rest of the system in vapor form. The vaporization may occur utilizing any type of vaporizer known in the art. For example, the vaporizer may be a flash vaporizer, a bubbler, of a ProEVap system. Other vaporizers and source types will be known to one of skill in the art. Deposition on the source, therefore, may include deposition on the vaporizer, regardless of the type of vaporizer employed.

Precursors utilized in such a system, which may result in residue and deposits on the componentry of the CVD system may include any precursor suitable for CVD and known to those of skill in the art.

Therefore the invention provides methods that can clean any component of the CVD system that contains residue or deposits resulting from the precursor itself or any reaction products or by products thereof. The cleaning methods can also clean any deposits resulting from reaction of the precursor with the system components themselves.

Specifically, the present invention in one embodiment relates to the in situ removal of residue from the CVD system and components contained therein by contacting the reactor and/or other components with a gas-phase reactive halide composition, e.g., $XeF_2$, $XeF_4$, $XeF_6$, $NF_3$, $F_2$, $XeF_6$, $SF_6$, $C_2F_6$, $CF_4$, $IF_5$, $IF_7$, $KrF_2$, $Cl_2$, $HCl$, $ClF_3$, $ClO_2$, $N_2F_4$, $N_2F_2$, $N_3F$, $NFH_2$, $NH_2F$, $HOBr$, $Br_2$, $C_3F_8$, $C_4F_8$, $C_5F_8$, $CHF_3$, $CH_2F_2$, $CH_3F$, $COF_2$, $HF$, $C_2HF_5$, $C_2H_2F_4$, $C_2H_3F_3$, $C_2H_4F_2$, $C_2H_5F$, $C_3F_6$, and organochlorides such as $COCl_2$, $CCl_4$, $CHCl_3$, $CH_2Cl_2$, and $CH_3Cl$, for sufficient time and under sufficient conditions to at least partially remove the residue from the components, and to do so in such a manner that residue is removed selectively with respect to the materials from which the components of the CVD system are constructed when the residue and the material from which the components are constructed is different, but remove both the residue and at least some material from which the components are constructed when the is residue and the material from which the components are constructed is the same.

In another embodiment, the CVD system components are cleaned ex situ, in a separate dedicated chamber to which the components are removed from the CVD system.

Considering in situ cleaning in further detail, such cleaning is primarily dependent on three factors: the reactive nature of the cleaning precursor, the volatility of the cleaning reaction by-products, and the reaction conditions employed in the chemical cleaning. The cleaning composition must remove unwanted residue while minimizing wear of the materials of construction of the system. The byproducts generated by the cleaning reaction must be volatile enough to facilitate their removal from the system.

Several modes of delivery of the gas-phase reactive composition, e.g., a composition including $XeF_2$, to the reactor region for in situ cleaning therein are discussed more fully above with respect to ion implantation system cleaning. These modes include a stagnant mode, a continuous mode, and a direct introduction mode. Although reference is made herein to a $XeF_2$ composition, as a preferred cleaning reagent material, it will be understood that other fluorinated xenon compounds and other reactive halide compositions may be used, including, without limitation, $XeF_4$, $XeF_6$, $SF_6$, $C_2F_6$, $IF_5$, $IF_7$, $KrF_2$, $CF_4$, $Cl_2$, $HCl$, $ClF_3$, $ClO_2$, $N_2F_4$, $N_2F_2$, $N_3F$, $NFH_2$, $NH_2F$, $HOBr$, $Br_2$, $C_3F_8$, $C_4F_8$, $C_5F_8$, $CHF_3$, $CH_2F_2$, $CH_3F$, $COF_2$, $HF$, $C_2HF_5$, $C_2H_2F_4$, $C_2H_3F_3$, $C_2H_4F_2$, $C_2H_5F$, $C_3F_6$, and organochlorides such as $COCl_2$, $CCl_4$, $CHCl_3$, $CH_2Cl_2$, and $CH_3Cl$. It is further noted that the gas-phase reactive material may comprise, consist essentially of or consist of the reactive halide compound(s).

Temperature and pressure settings of the CVD system may be varied during cleaning to optimize cleaning of the system.

The features and advantages of the invention are more fully shown by the following non-limiting examples.

Example 1

Test samples were prepared using electron beam deposition of aluminum, boron, tungsten and silicon on glass microscope slides. The aluminum was used as a bottom layer barrier on the glass slide. Some samples were capped with a protective silicon layer while others were left uncapped and allowed to oxidize. The test samples were sequentially placed into an ex situ $XeF_2$ reactor, of a type as shown and described with reference to FIG. 4 hereof, and etched for 16 one-minute pulse-etch cycles at a pressure of 300-400 mTorr at room temperature.

Figure 5:
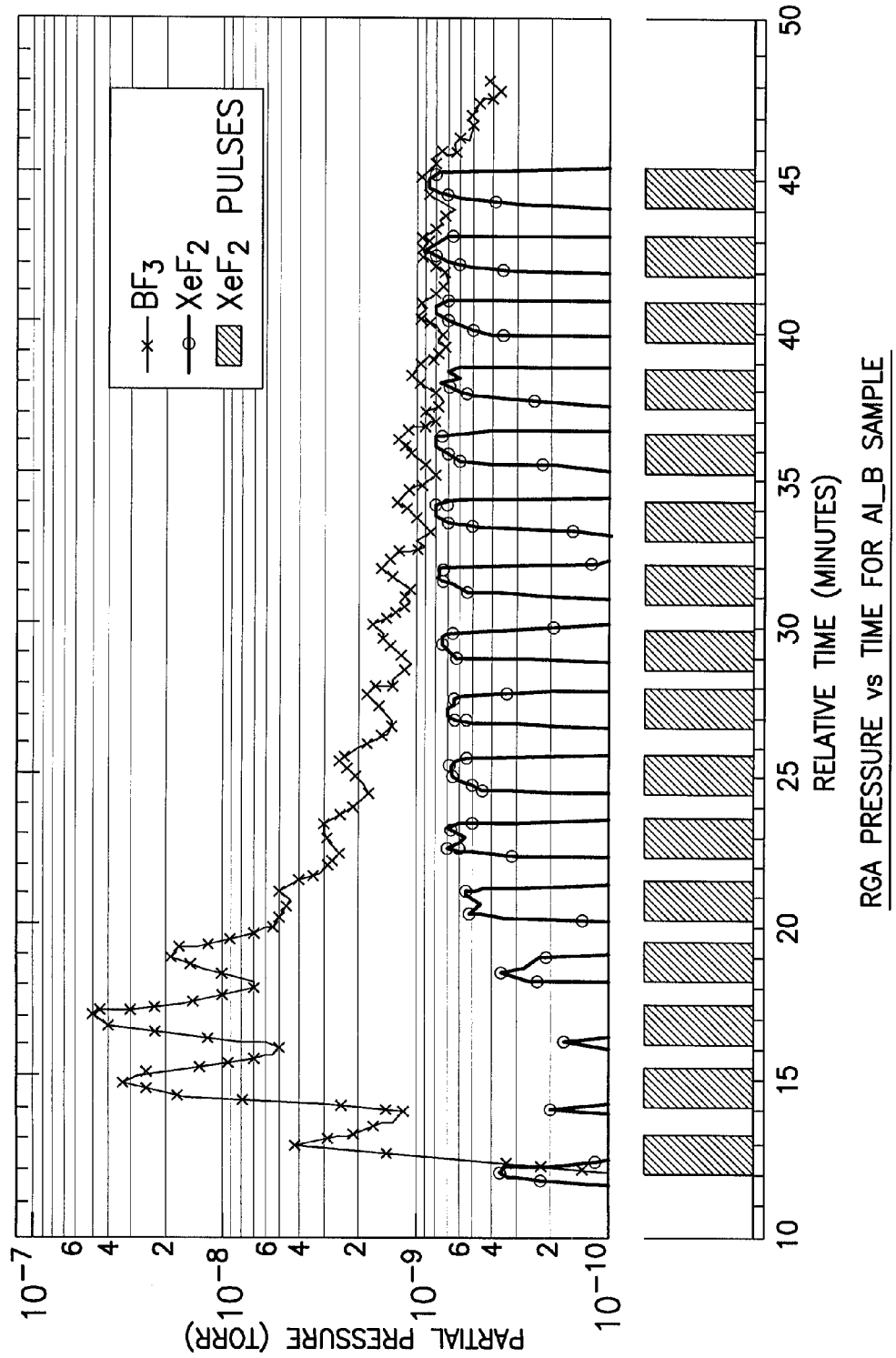
FIG. 5 is an RGA trace as a function of time showing the efficacy of $XeF_2$ in removing boron residue from an aluminum base layer on a glass microscope slide.

FIG. 5 is an RGA trace as a function of time showing the efficacy of $XeF_2$ in removing boron residue from an aluminum base layer. The pulse-etch cycles are shown by peaks in the RGA pressure plot in FIG. 5.

The RGA determined the removal of boron from a glass slide having a base layer of 500 nm of aluminum with 500 nm of boron deposited thereon. There was no silicon capping layer, and therefore the boron could have potentially formed an oxide layer prior to etching. The $XeF_2$ etch process removed most of the boron in about 4 cycles with a concomitant increase in unreacted $XeF_2$, indicating that boron removal was decreasing or had ceased altogether.

FIG. 5 illustrates that the boron layer was readily removed using the $XeF_2$ system and method of the present invention, even if an oxide layer had formed thereon prior to etching.

Figure 6:
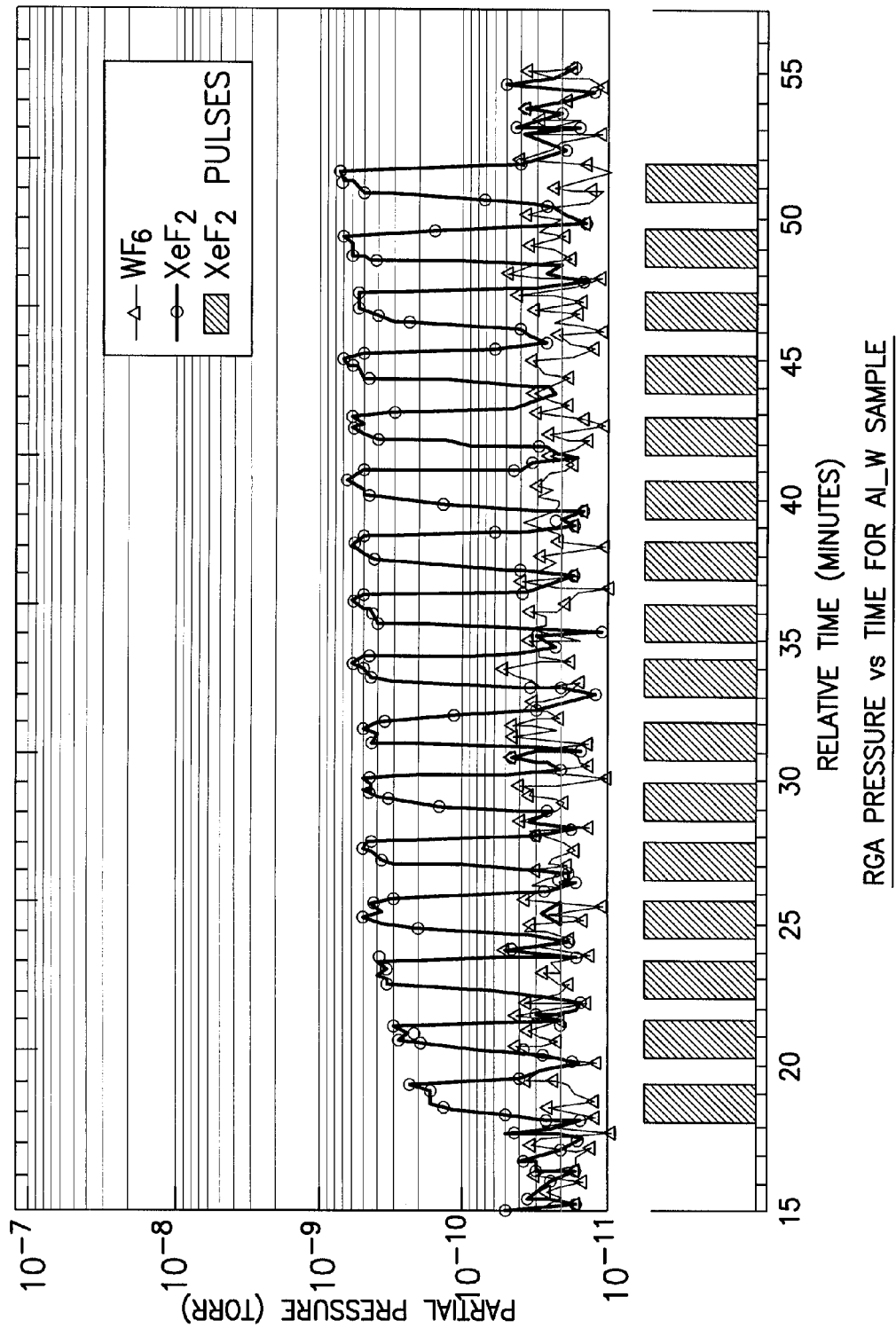
FIG. 6 is an RGA trace as a function of time illustrating the reactivity of $XeF_2$ with a tungsten layer on an aluminum base layer on a glass microscope slide.

FIG. 6 illustrates the removal, as determined by RGA, of tungsten from a glass slide having a base layer of 500 nm of aluminum with 150 nm of tungsten deposited thereon. There was no silicon capping layer, and therefore the tungsten could have potentially formed an oxide layer prior to etching. No tungsten compounds were observed by RGA, however, it may have been $WF_6^+$ that was monitored.

Example 2

Figure 7:
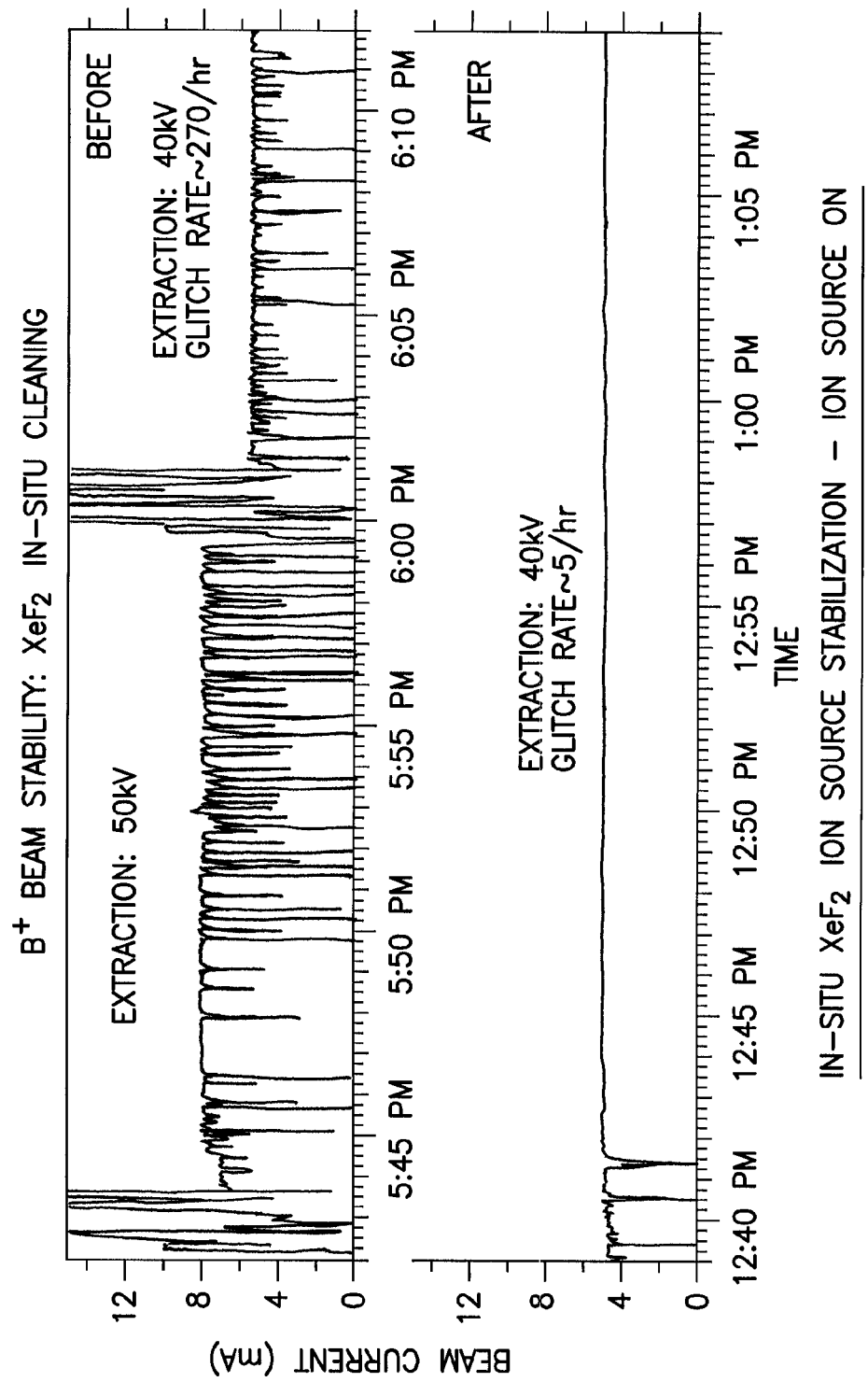
FIG. 7 is a graph of beam current, in mA, as a function of time, showing the use of $XeF_2$ plasma to improve stability of the ion source.
Figure 8:
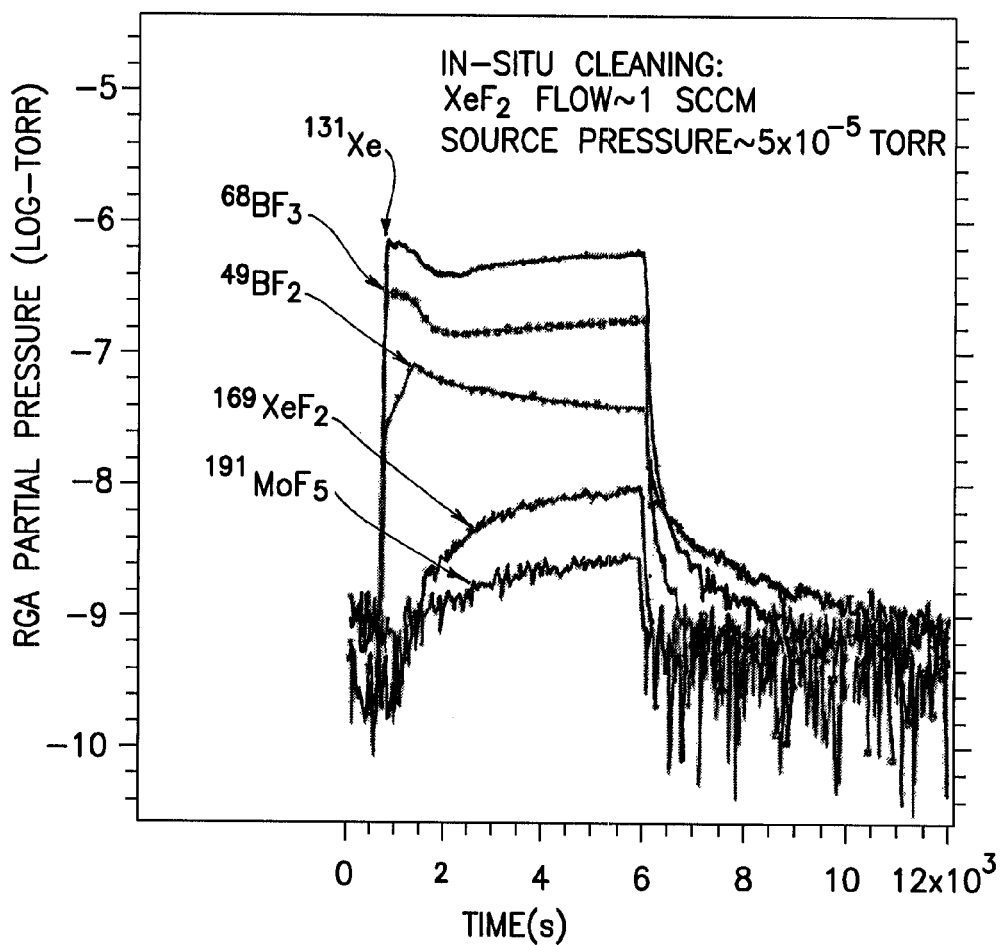
FIG. 8 is a graph of RGA partial pressure (log-Torr), as a function of time, in seconds, showing the use of $XeF_2$ as a cleaning agent for a cold ion source.

FIGS. 7 and 8 show data taken on an ion source test apparatus including a single filament Bernas Source with molybdenum arc chamber, and an 80° analyzing magnet with faraday cup measurement of the analyzed beam. A cylinder of $XeF_2$ operating at ambient temperature was installed in the gas box and connected to the ion source with a conventional high conductance gas line.

FIG. 7 is a graph of beam current, in mA, as a function of time, showing the use of $XeF_2$ plasma to improve stability of the ion source. The source was run with $BF_3$ plasma for about 12 hours at its beam current specification limit, which corresponds to an analyzed beam of about 10 mA of $^{11}B^+$. When the beam current measurements shown in FIG. 7 began, the source exhibited severe instability at 50 kV extraction voltage, and this instability was not significantly improved by reducing the voltage to 40 kV. After running $XeF_2$ plasma for 20 minutes, the source ran unexpectedly much more stably for about two more hours.

While we do not wish to be bound by any theory or hypothesis as regards the mechanism of such stability improvement, such improvement may be attributable to the capability of the $XeF_2$ plasma to remove deposits either from a source insulator or from the high voltage gap of the ion implanter apparatus.

FIG. 8 is a graph of RGA partial pressure (log-Torr), as a function of time, in seconds, showing the use of $XeF_2$ as a cleaning agent for a cold ion source. FIG. 8 shows measurements from an RGA unit located on the source vacuum chamber immediately above the ion source. In this case, $XeF_2$ vapor was flowed for about two hours through a cold ion source which had previously been running high current $B^+$ beam from $BF_3$. The $BF_3$ and $BF_2$ RGA peaks from etching of boron can be seen clearly in the graph. The intensity of $MoF_5$ from etching of the molybdenum arc chamber is about 100 times smaller than the $BF_3$ intensity. It can be seen that $XeF_2$ is strongly consumed at the beginning of the measurement, and the signal subsequently rises. The graph is consistent with the continued etching of boron until the $XeF_2$ flow was discontinued after 6000 seconds, at which point the etching ceases.

Example 3

While the above Example 1 shows non-reactivity of $XeF_2$ with tungsten on aluminum on a glass slide, it has been found that for an operational ion implantation system, $XeF_2$ is an effective cleaning agent of tungsten deposits generated by reaction of the system components (specifically the arc chamber) with the fluorinated feedstock gas.

A Bernas source was operated with $BF_3$ feedstock at maximum $B^+$ beam current for 52 hours. The source was removed and two alumina repeller insulators, coated with deposits were removed. Both insulators were weighed prior to cleaning. Insulator 1 (bushing) weighed 6.1676 g prior to cleaning and Insulator 2 (spacer) weighed 7.0662 prior to cleaning. The two insulators were placed in an ex situ vacuum chamber and were cleaned using eleven fill/vent cycles with $XeF_2$, at pressures up to about 3 torr. Each cycle lasted approximately 10 minutes. The mass of $XeF_2$ used in each cycle was about 0.10 g.

Figure 10:
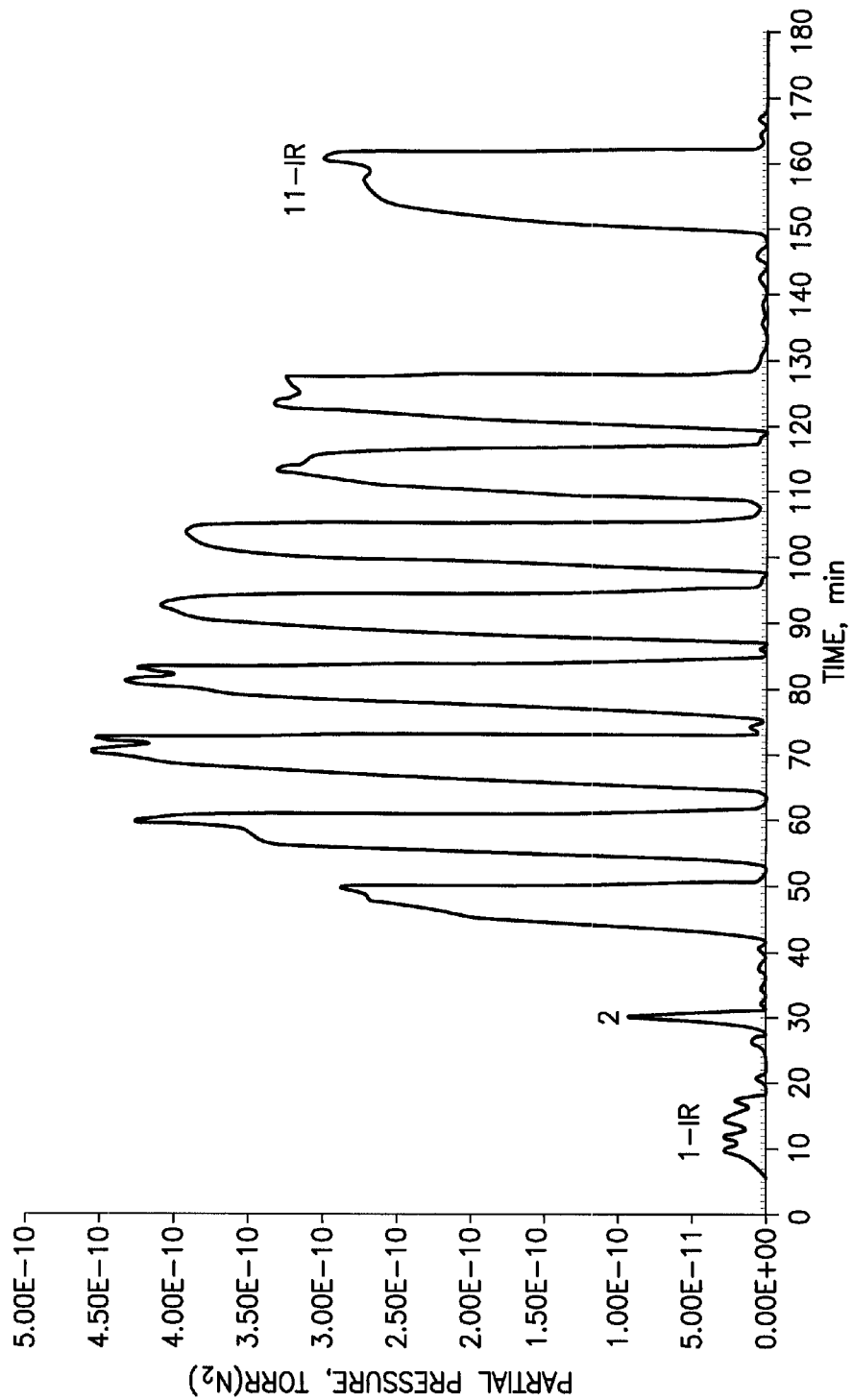
FIG. 10 is a graph of RGA partial pressure, as a function of time, in minutes, showing the use of $XeF_2$ as a cleaning agent for cleaning two repeller insulators.
Figure 11:
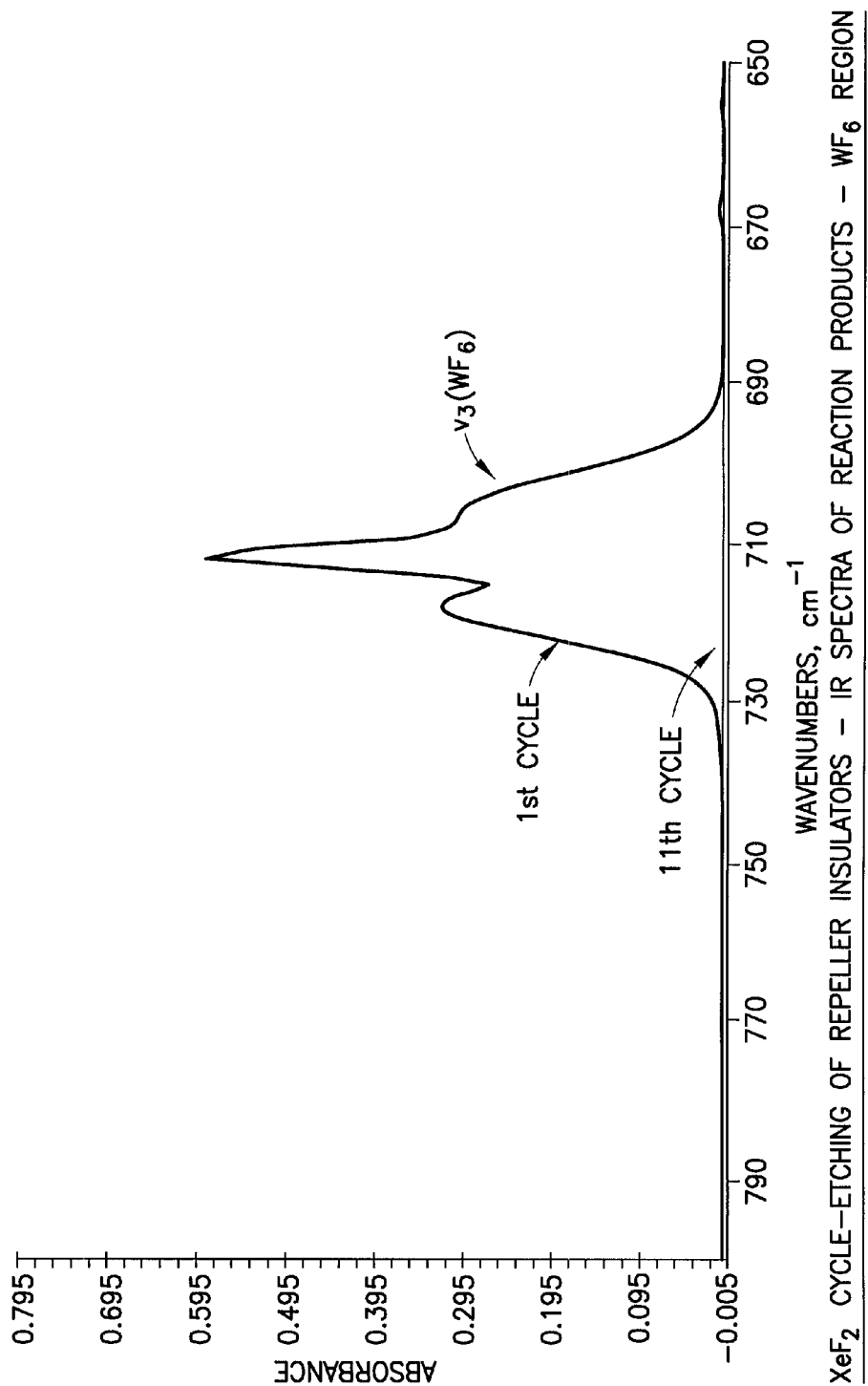
FIG. 11 is the $WF_6$ region of the IR spectra of the reaction products in the $XeF_2$ cleaning of the two repeller insulators.

While the cleaning cycles were performed, the RGA spectra were continuously measured (FIG. 10). The IR spectra were measured after each cycle (FIG. 11).

Upon completion of the cycles, both insulators were weighed again. Insulator 1 (bushing) weighed 6.1583 g after cleaning and Insulator 2 (spacer) weighed 7.0371 g after cleaning. Accordingly, Insulator 1 lost 0.0093 g by cleaning, a 0.2% loss and Insulator 2 lost 0.0291 g by cleaning, a 0.4% loss. Therefore it was found that about 0.11 g of $XeF_2$ (a single cycle) removed a total of 0.0358 g tungsten deposits from both insulators.

Figure 12:
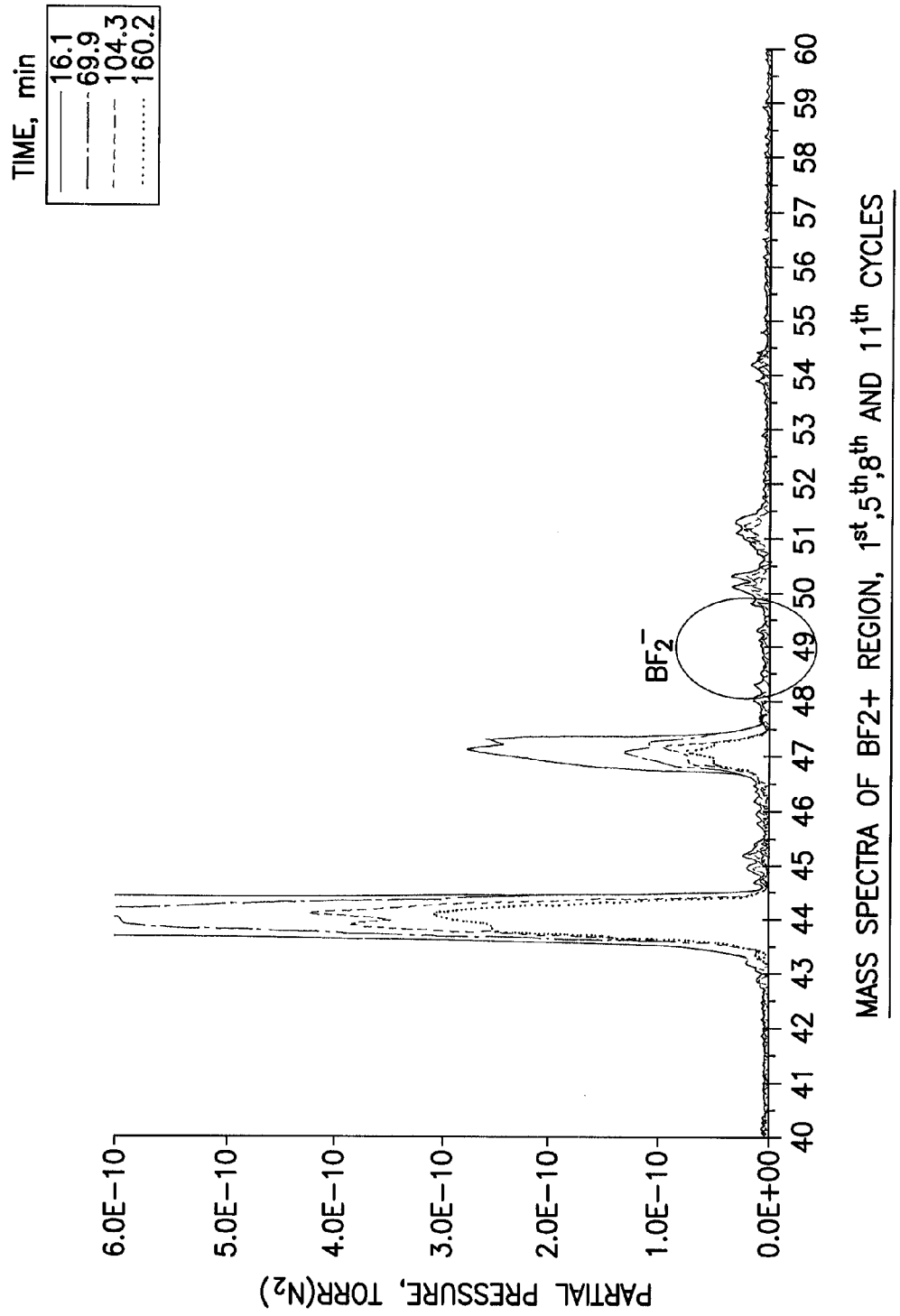
FIG. 12 is mass spectra of the $BF_2^+$ region in the $XeF_2$ cleaning of the two repeller insulators.
Figure 13:
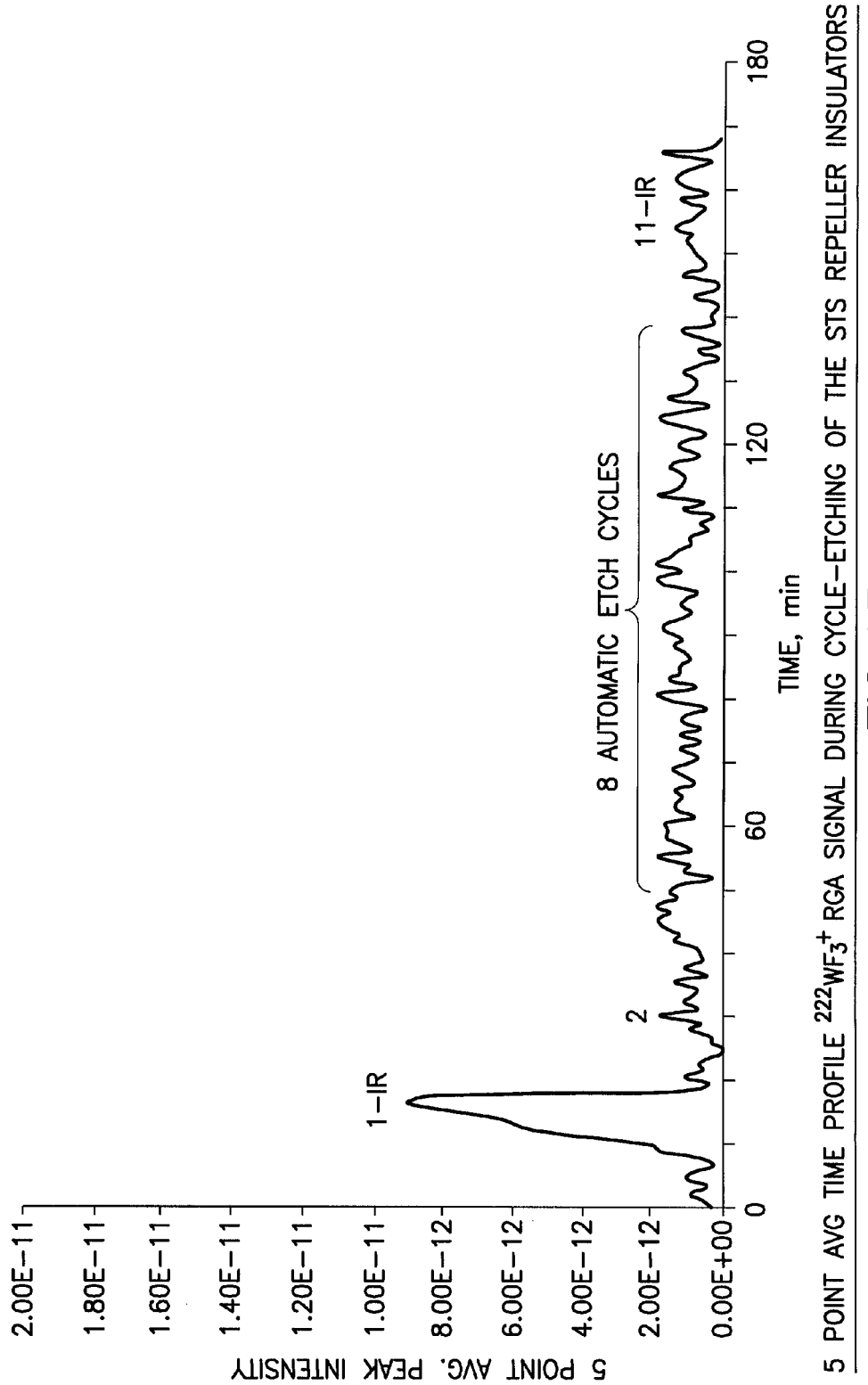
FIG. 13 is a graph of the 5 point average peak intensity as a function of time, in minutes, in the $XeF_2$ cleaning of the two repeller insulators.

It was found that the deposits on the insulators contained no boron (FIG. 12), that the main constituents of the deposits were tungsten and carbon (carbon data not presented herein). While 0.0358 g of tungsten contamination was easily be removed by $XeF_2$ etching at room temperature with a single cycle (FIG. 13), the carbon deposits could not be removed from the insulators at room temperature within the full 11 cycles. No reaction of the $XeF_2$ with the alumina insulators was observed.

Example 4

A new unused graphite repeller plate was found to weigh 5.179 g. The plate was installed in a Bernas source, which was then was operated with $BF_3$ feedstock at maximum $B^+$ beam current for 52 hours. The source was removed and the repeller plate coated with deposits was removed. The repeller plate was weighed prior to cleaning and found to weigh 7.091 g. The plate was placed in an ex situ vacuum chamber and cleaned using fifty-two fill/vent cycles with $XeF_2$, at pressures of about 2-3 torr. Each cycle lasted approximately 10 minutes. The mass of $XeF_2$ used was about 4.62 g.

Figure 14:
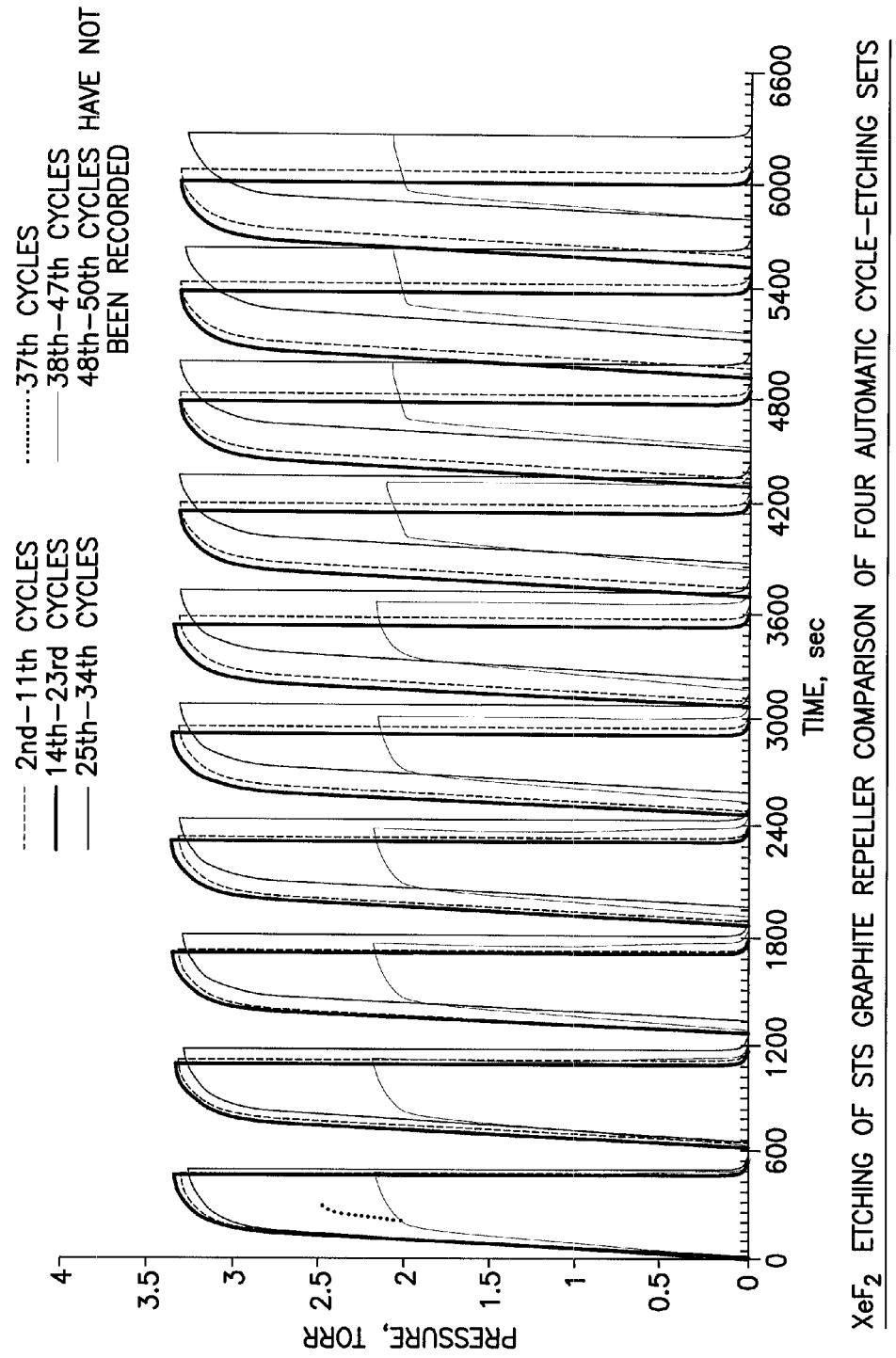
FIG. 14 is a graph of pressure as a function of time, in seconds, in the use of $XeF_2$ as a cleaning agent for cleaning a graphite repeller plate.
Figure 15:
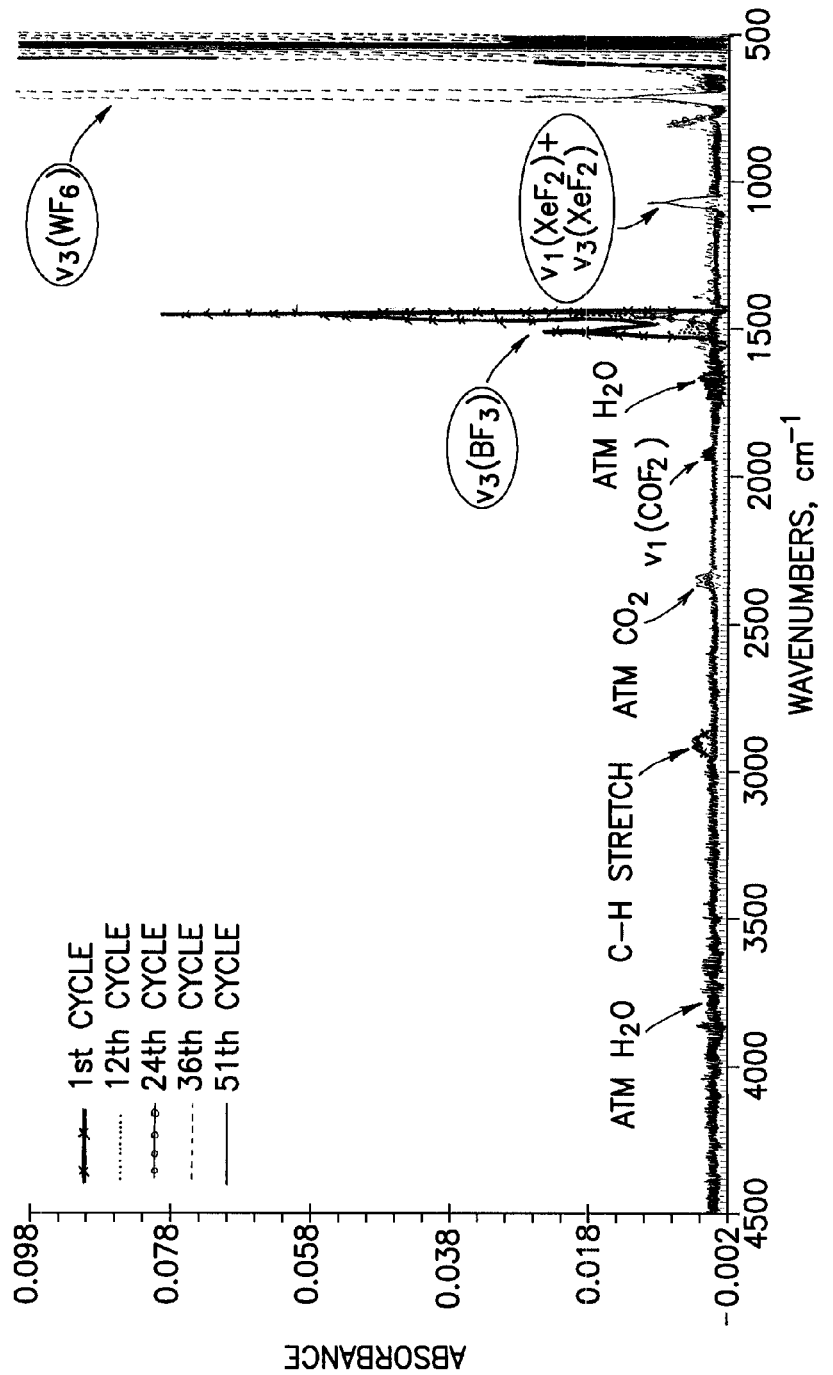
FIG. 15 is the IR spectra of the reaction products in the $XeF_2$ cleaning of a graphite repeller plate.
Figure 16:
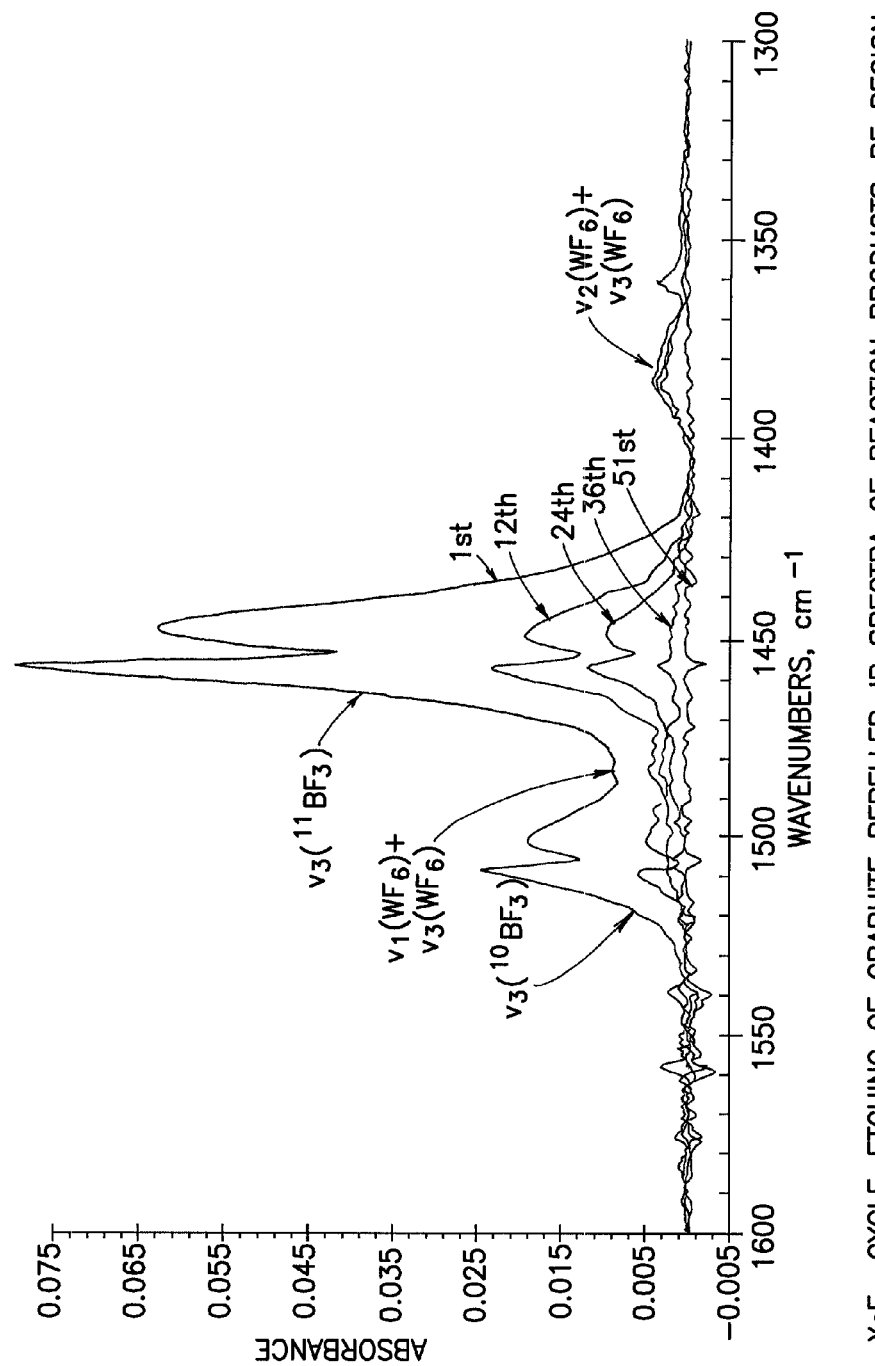
FIG. 16 is the $BF_3$ region of the IR spectra of the reaction products in the $XeF_2$ cleaning of a graphite repeller plate.
Figure 17:
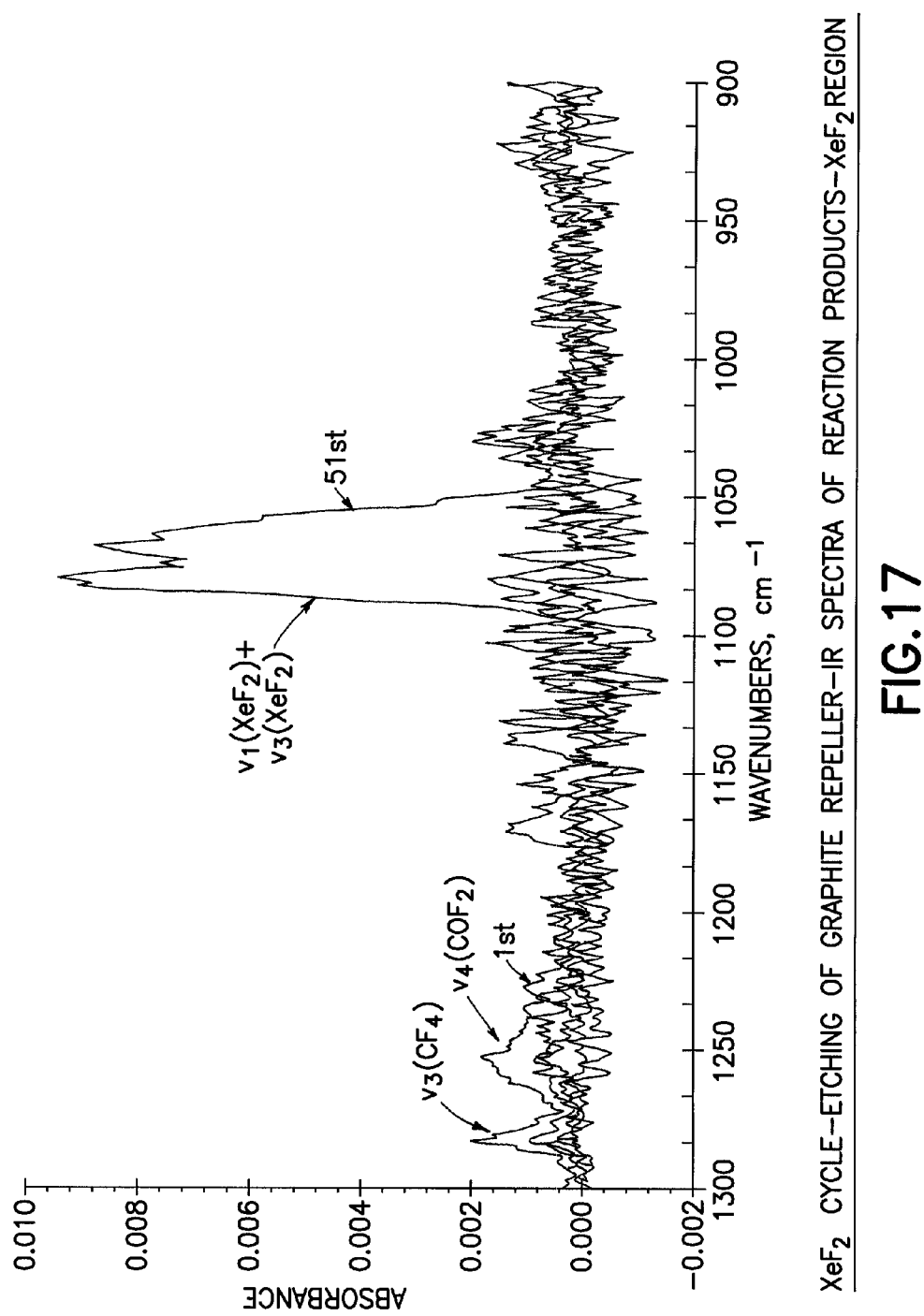
FIG. 17 is the $XeF_2$ region of the IR spectra of the reaction products in the $XeF_2$ cleaning of a graphite repeller plate.
Figure 18:
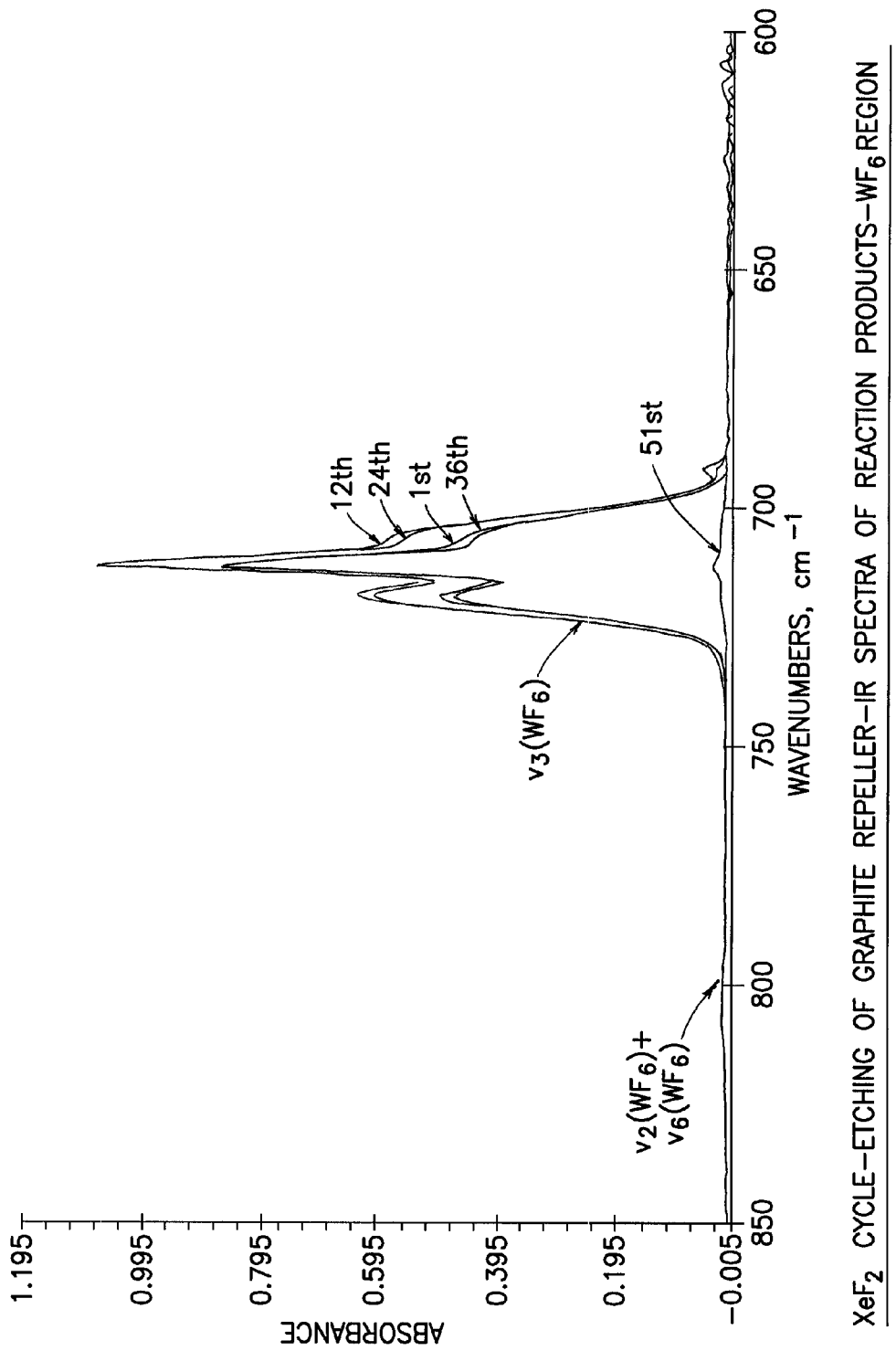
FIG. 18 is the $WF_6$ region of the IR spectra of the reaction products in the $XeF_2$ cleaning of a graphite repeller plate.

While the cleaning cycles were performed, the pressure was continuously measured (FIG. 14). The IR spectra were measured after each cycle. A summary of the IR findings is set forth in FIG. 15 and FIGS. 16-18 show more detailed views of the spectra from the $BF_3$ region, the $XeF_2$ region and the $WF_6$ region, respectively.

Upon completion of the cycles, the plate was weighed again and found to weigh 5.424 g. Accordingly, the plate lost 1.667 g due to etching. It was therefore found that about 4.60 g of $XeF_2$ removed a total of about 1.667 g deposits from the plate.

It was found that the deposits on the repeller were high (about 99%) in tungsten and that the other materials present, e.g. boron, was present in an amount less than 1%. The $XeF_2$ utilization was found to be high, about 90%. FIG. 19 shows the relative concentration profiles of $BF_3$, $XeF_2$ and $WF_6$ during the $XeF_2$ cycle etching of the graphite repeller.

The results of this experiment also show that heavily deposited tungsten and boron contaminants can be removed from a graphite ion source part by $XeF_2$ etching. The product of $XeF_2$ etching of boron is $BF_3$ and the product of $XeF_2$ etching of tungsten is $WF_6$. No reaction of the $XeF_2$ with the graphite repeller itself was observed. Therefore, high utilization of $XeF_2$ can be achieved with static cleaning.

While the invention has been described herein with reference to various specific embodiments, it will be appreciated that the invention is not thus limited, and extends to and encompasses various other modifications and embodiments, as will be appreciated by those ordinarily skilled in the art. Accordingly, the invention is intended to be broadly construed and interpreted, in accordance with the ensuing claims.

What is claimed is:

1. An ion implantation method, comprising generating a plasma in an arc chamber of an ion implantation system from a dopant source gas flowed through the arc chamber to form dopant source ions for implantation, and during at least part of the time during which the dopant source gas is flowed through the arc chamber, flowing cleaning gas through the arc chamber concurrently with the dopant source gas, to effect cleaning in the ion implantation system, wherein the cleaning gas comprises an $XeF_2$ plasma which produces $Xe^+$ ions effective for sputter cleaning.

2. A method of cleaning one or more components of an ion implantation system for at least partial removal of an ionization-related deposit from said one or more components, said method comprising contacting said one or more components with a cleaning composition comprising a gas-phase reactive material, under conditions enabling reaction of the gas-phase reactive material with the deposits to effect said at least partial removal, wherein said gas-phase reactive material comprises $XeF_2$, wherein said one or more components is an ion source, and wherein contacting comprises cleaning said ion source between successive ion generation processes involving different dopant source gases, in which such method comprises flowing $XeF_2$ through the ion source between such processes with a plasma, wherein contacting further comprises generating an $XeF_2$ plasma in said ion source, to produce $Xe^+$ ions effective for sputter cleaning of the ion source and $Xe^+$ ions effective for sputter cleaning of components downstream of the ion source.

3. The method of claim 2, wherein the ion implantation system is adapted to conduct an ion implantation process selected from the group consisting of plasma immersion and molecular ion implantation.

4. The method of claim 2, wherein said deposit includes at least one of boron, silicon, arsenic, phosphorus, germanium, tungsten, molybdenum, selenium, antimony, indium tantalum and carbon, and wherein said one or more components is contacted with the gas-phase reactive material for sufficient time to at least partially remove said deposit from one or more components.

5. The method of claim 2, wherein contacting comprises
(a) continuously flowing a gas-phase reactive material from a cleaning composition source into a vacuum chamber of the ion implantation system; and
(b) regulating the partial pressure of the gas-phase reactive material in the vacuum chamber by use of a control valve on an output of the vacuum chamber, wherein the gas-phase reactive material reacts selectively with the deposit on the vacuum chamber or the at least one component therein.

6. The method of claim 5 wherein the continuous flow of gas-phase reactive material is flowing at a variable rate.

* * * * *